(12) United States Patent
Matsumoto

(10) Patent No.: US 9,153,481 B2
(45) Date of Patent: Oct. 6, 2015

(54) MANGANESE-CONTAINING FILM FORMING METHOD, PROCESSING SYSTEM, ELECTRONIC DEVICE MANUFACTURING METHOD AND ELECTRONIC DEVICE

(71) Applicant: TOKYO ELECTRON LIMITED, Tokyo (JP)

(72) Inventor: Kenji Matsumoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 100 days.

(21) Appl. No.: 14/139,089

(22) Filed: Dec. 23, 2013

(65) Prior Publication Data

US 2014/0183742 A1   Jul. 3, 2014

(30) Foreign Application Priority Data

Dec. 27, 2012 (JP) ................................ 2012-285441

(51) Int. Cl.
| | |
|---|---|
| *H01L 21/20* | (2006.01) |
| *H01L 21/36* | (2006.01) |
| *H01L 21/768* | (2006.01) |
| *H01L 23/532* | (2006.01) |
| *H01L 21/285* | (2006.01) |

(52) U.S. Cl.
CPC .... *H01L 21/76846* (2013.01); *H01L 21/28556* (2013.01); *H01L 21/76814* (2013.01); *H01L 21/76828* (2013.01); *H01L 21/76831* (2013.01); *H01L 21/76855* (2013.01); *H01L 21/76867* (2013.01); *H01L 21/76882* (2013.01); *H01L 23/53238* (2013.01); *H01L 23/53266* (2013.01)

(58) Field of Classification Search
CPC ................... H01L 21/28556; H01L 21/67207; H01L 21/76814; H01L 21/76828; H01L 23/53238
USPC .......................................... 257/774; 438/509
See application file for complete search history.

(56) References Cited

U.S. PATENT DOCUMENTS

| | | | |
|---|---|---|---|
| 2008/0054466 A1* | 3/2008 | Nasu et al. ..................... | 257/751 |
| 2008/0088021 A1* | 4/2008 | Wada et al. .................... | 257/751 |
| 2008/0142947 A1 | 6/2008 | Pan et al. | |

(Continued)

FOREIGN PATENT DOCUMENTS

| | | |
|---|---|---|
| JP | 2007067107 A | 3/2007 |
| JP | 4236201 B2 | 12/2008 |

(Continued)

*Primary Examiner* — Nicholas Tobergte
(74) *Attorney, Agent, or Firm* — Nath, Goldberg & Meyer; Jerald L. Meyer

(57) ABSTRACT

A manganese-containing film forming method for forming a manganese-containing film on an underlying layer containing silicon and oxygen includes: degassing the underlying layer formed on a processing target by thermally treating the processing target, the underlying layer containing silicon and oxygen; and forming a manganese metal film on the degassed underlying layer by chemical deposition using a gas containing a manganese compound. Forming a manganese metal film includes: setting a film formation temperature to be higher than a degassing temperature; introducing a reducing reaction gas; and forming a manganese-containing film including an interfacial layer formed in an interface with the underlying layer and a manganese metal film formed on the interfacial layer, the interfacial layer being made up of a film of at least one of a manganese silicate and a manganese oxide.

32 Claims, 15 Drawing Sheets

(56) References Cited

U.S. PATENT DOCUMENTS

| | | | |
|---|---|---|---|
| 2008/0142974 A1* | 6/2008 | Arakawa | 257/754 |
| 2009/0263965 A1 | 10/2009 | Gordon et al. | |
| 2011/0163062 A1* | 7/2011 | Gordon et al. | 216/13 |
| 2012/0141667 A1* | 6/2012 | Kim et al. | 427/123 |
| 2014/0183742 A1* | 7/2014 | Matsumoto | 257/751 |

FOREIGN PATENT DOCUMENTS

| | | |
|---|---|---|
| JP | 2010242187 A | 10/2010 |
| WO | 2012/060428 A1 | 5/2012 |

* cited by examiner

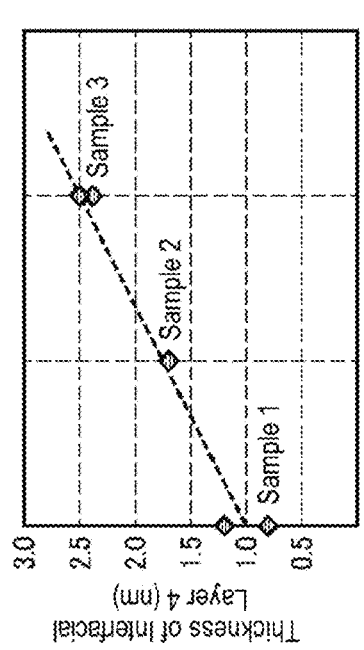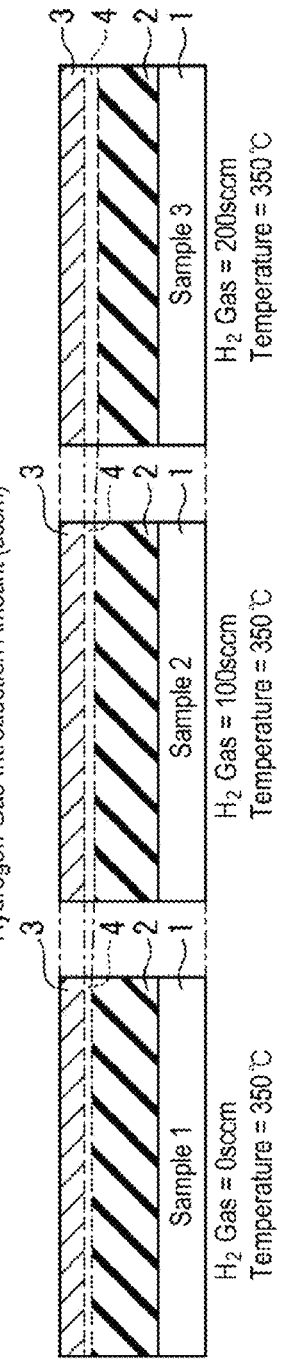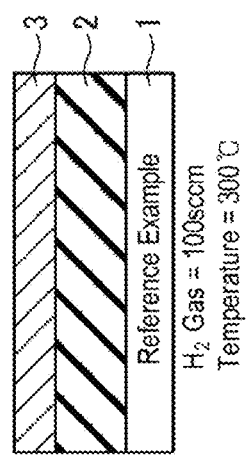
FIG. 7A
FIG. 7B
FIG. 7C

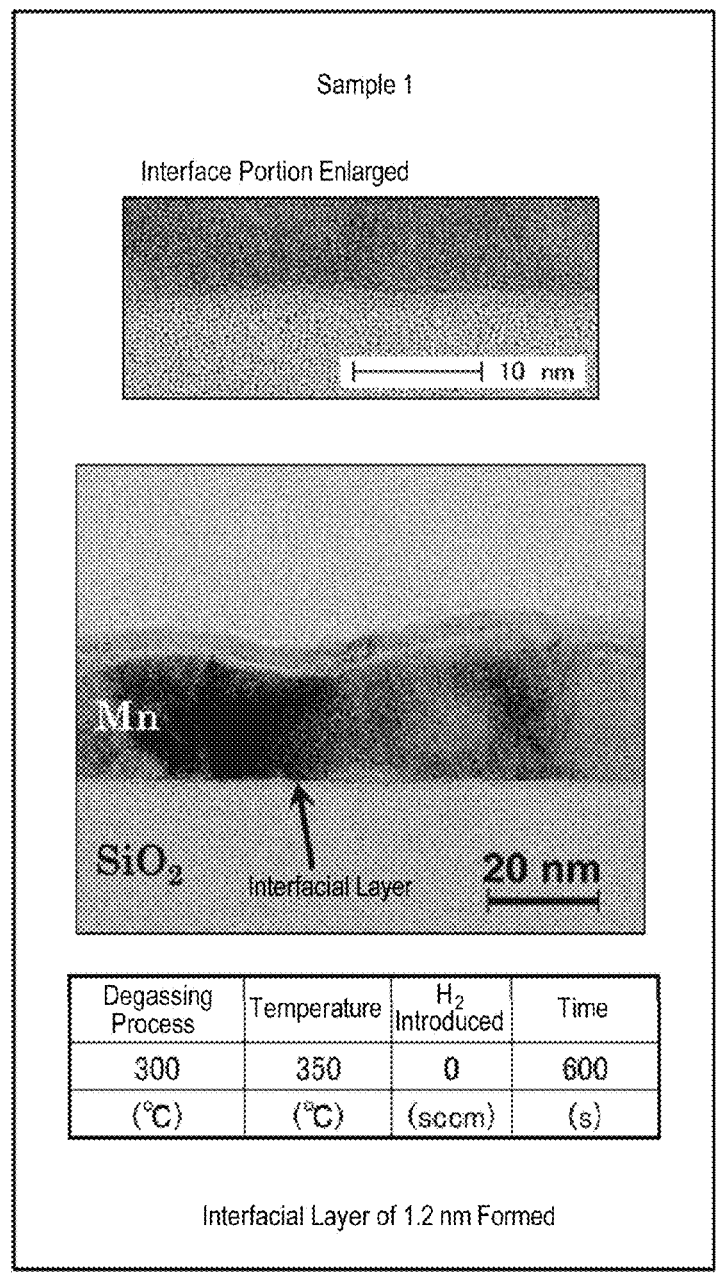

MANGANESE-CONTAINING FILM FORMING METHOD, PROCESSING SYSTEM, ELECTRONIC DEVICE MANUFACTURING METHOD AND ELECTRONIC DEVICE

CROSS-REFERENCE TO RELATED APPLICATION

This application claims the benefit of Japanese Patent Application No. 2012-285441, filed on Dec. 27, 2012, in the Japan Patent Office, the disclosure of which is incorporated herein in its entirety by reference.

TECHNICAL FIELD

The present disclosure relates to a manganese-containing film forming method, a processing system, an electronic device manufacturing method and an electronic device.

BACKGROUND

With a view to form an ultrafine copper wiring in a semi-conductor device, there is proposed a method of forming a barrier film composed of a manganese silicate ($MnSiO_3$ or $Mn_2SiO_4$) film by a chemical vapor deposition (hereinafter referred to as CVD) method. In this method, a manganese metal film is formed by depositing a manganese metal on a silicon-containing oxide film formed on a substrate using a manganese precursor. Then, the substrate having the manganese metal film formed thereon is annealed for five minutes at a temperature of 300 to 400 degrees C. under an atmosphere added with a small amount of oxygen. Thus, the manganese metal becomes a silicate by reacting with silicon and oxygen of the underlying silicon-containing oxide film, whereby a manganese silicate film is formed.

In this method, the annealing is performed after forming a copper film on a manganese metal film.

However, it was found that, even if a manganese metal film is formed by depositing a manganese metal on a silicon-containing oxide film as an underlying layer through the use of a CVD method, an interfacial layer composed of a manganese silicate may sometimes not formed in an interface with the silicon-containing oxide film. Even though the interfacial layer is formed, it is unclear in the CVD method what kind of parameter decides the existence or absence of the interfacial layer composed of a manganese silicate. Furthermore, a barrier film composed of a manganese silicate film cannot be said to have sufficiently high adhesion to an upper-layer metal film (e.g., a copper film).

Moreover, the thickness of a barrier film affects a barrier property. From the viewpoint of avoiding the reduction of a cross-sectional area of a groove or a via-hole buried with a metal wiring, it is required to make the barrier film thinner. In the CVD method, it is unclear what kind of parameter decides the thickness of the interfacial layer.

SUMMARY

Some embodiments of the present disclosure provide a manganese-containing film forming method using chemical deposition (CVD or ALD (Atomic Layer Deposition)), which is capable of forming a manganese-containing film that includes a film composed of a manganese silicate and/or a manganese oxide and formed in an interface with an underlying layer containing silicon and oxygen and that shows high adhesion to an upper-layer metallic film.

Furthermore, some embodiments of the present disclosure provide a manganese-containing film forming method using chemical deposition (CVD or ALD), which is capable of controlling the thickness of a film composed of a manganese silicate and/or a manganese oxide.

Moreover, some embodiments of the present disclosure provide a processing system capable of carrying out the manganese-containing film forming method, an electronic device manufacturing method using the manganese-containing film forming method and an electronic device obtained by the electronic device manufacturing method.

In accordance with a first aspect of the present disclosure, there is provided a manganese-containing film forming method for forming a manganese-containing film on an underlying layer containing silicon and oxygen. The method includes: degassing the underlying layer formed on a processing target by thermally treating the processing target, the underlying layer containing silicon and oxygen; and forming a manganese metal film on the degassed underlying layer by chemical deposition using a gas containing a manganese compound. Forming a manganese metal film includes: setting a film formation temperature to be higher than a degassing temperature; introducing a reducing reaction gas; and forming a manganese-containing film including an interfacial layer formed in an interface with the underlying layer and a manganese metal film formed on the interfacial layer, the interfacial layer being made up of a film of at least one of a manganese silicate and a manganese oxide.

In accordance with a second aspect of the present disclosure, there is provided a manganese-containing film forming method for forming a manganese-containing film on an underlying layer containing silicon and oxygen. The method includes: degassing the underlying layer formed on a processing target by thermally treating the processing target, the underlying layer containing silicon and oxygen; and forming a manganese metal film on the degassed underlying layer by chemical deposition using a gas containing a manganese compound. Forming a manganese metal film includes: setting a film formation temperature to be higher than a degassing temperature; introducing a reducing reaction gas while controlling an amount of the reducing reaction gas; and forming a manganese-containing film including an interfacial layer formed in an interface with the underlying layer and a manganese metal film formed on the interfacial layer, the interfacial layer being made up of a film of at least one of a manganese silicate and a manganese oxide, while controlling a thickness of the interfacial layer.

In accordance with a third aspect of the present disclosure, there is provided a manganese-containing film forming method for forming a manganese-containing film on an underlying layer containing silicon and oxygen. The method includes: degassing the underlying layer formed on a processing target by thermally treating the processing target, the underlying layer containing silicon and oxygen; forming a manganese metal film on the degassed underlying layer by chemical deposition using a gas containing a manganese compound; and annealing the underlying layer, on which the manganese metal film is formed, in a reducing atmosphere created by supplying a reducing gas. Forming a manganese metal film includes setting a film formation temperature to be higher than a degassing temperature. Annealing the underlying layer includes: setting an annealing temperature to be a temperature at which a manganese oxide is converted into a silicate; and forming a manganese-containing film including an interfacial layer formed in an interface with the underlying layer and a manganese metal film formed on the interfacial layer, the interfacial layer being made up of a film of at least one of a manganese silicate and a manganese oxide.

In accordance with a fourth aspect of the present disclosure, there is provided an electronic device manufacturing method for manufacturing an electronic device which includes an interfacial layer including a film of at least one of a manganese silicate and a manganese oxide formed in an interface with an underlying layer containing silicon and oxygen. The method includes forming the interfacial layer according to the manganese-containing film forming method of the first to third aspects.

In accordance with a fifth aspect of the present disclosure, there is provided an electronic device including an interfacial layer having a film of at least one of a manganese silicate and a manganese oxide formed in an interface with an underlying layer containing silicon and oxygen. The interfacial layer is formed according to the electronic device manufacturing method of the fourth aspect.

In accordance with a sixth aspect of the present disclosure, there is provided a processing system for forming a manganese-containing film on an underlying layer containing silicon and oxygen. The system includes: a degassing unit configured to perform a degassing process with respect to a processing target having the underlying layer containing silicon and oxygen; a manganese metal deposition unit configured to form a manganese metal film by depositing a manganese metal on the degassed processing target; and a metal deposition unit configured to form a metallic film by depositing a metal on the processing target on which the manganese metal is deposited. The manganese metal deposition unit forms a manganese-containing film which includes an interfacial layer formed in an interface with the underlying layer and a manganese metal film formed on the interfacial layer, the interfacial layer being made up of a film of at least one of a manganese silicate and a manganese oxide, according to the manganese-containing film forming method of the first to third aspects.

With the present disclosure, it is possible to provide a manganese-containing film forming method using chemical deposition (CVD or ALD), which is capable of forming a manganese-containing film that includes a film composed of a manganese silicate and/or a manganese oxide and formed in an interface with an underlying layer containing silicon and oxygen and that shows high adhesion to an upper-layer metallic film.

Furthermore, it is possible to provide a manganese-containing film forming method using chemical deposition (CVD or ALD), which is capable of controlling the thickness of a film composed of a manganese silicate and/or a manganese oxide.

Moreover, it is possible to provide a processing system capable of carrying out the manganese-containing film forming method, an electronic device manufacturing method using the manganese-containing film forming method and an electronic device obtained by the electronic device manufacturing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7A is a view representing the relationship between the introduction amount of a hydrogen gas and the thickness of an interfacial layer, FIG. 7B is a section view of samples 1 to 3 corresponding to different hydrogen gas introduction amounts, and FIG. 7C is a section view showing a reference example.

FIG. 8A is a drawing substitute photograph (a transmission electron microscope photograph) showing a cross section of sample 1 shown in FIG. 7B.

DETAILED DESCRIPTION

Figure 1:
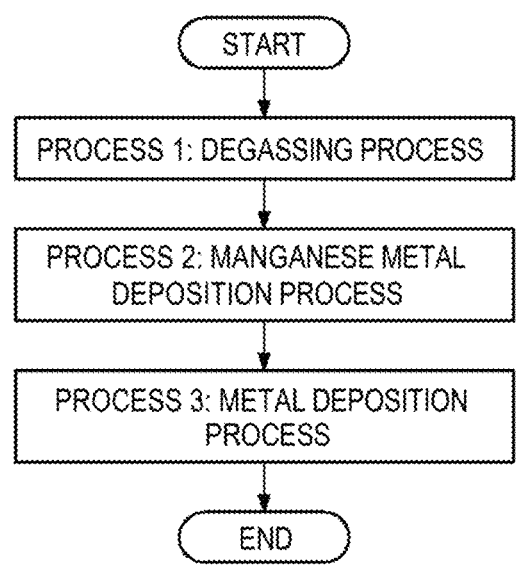
FIG. 1 is a flowchart showing one example of a manganese-containing film forming method according to a first embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present inventor conducted research on the relationship between film formation conditions and formation of an interfacial layer and, consequently, found the following facts.

(1) Prior to forming a manganese metal film, a degassing process is performed as a pretreatment for the removal of surplus adsorption water or the like existing on a substrate surface. The atmosphere of the degassing process does not affect formation of an interfacial layer even if an Ar gas or a forming gas (3% $H_2$+97% $N_2$) containing a H2 gas is used as the degassing atmosphere. That is to say, the type of gases used in the degassing process does not essentially affect formation of an interfacial layer.

(2) If a manganese metal film formation temperature is higher than a degassing temperature, an interfacial layer that includes a manganese oxide is easy to form. It is presumed that the residual moisture (physical adsorption water and chemical adsorption water) contained in an underlying layer reacts with a manganese precursor, thereby forming a manganese oxide in an interface between a manganese metal film and an underlying layer.

(3) By introducing a reducing gas, typically a hydrogen gas ($H_2$ gas), during the CVD film formation of a manganese metal film or during the post-treatment performed after the film formation, an interfacial layer that includes a manganese silicate and/or a manganese oxide (hereinafter referred to as "manganese silicate or the like") can be formed in an interface between a manganese metal film and an underlying layer. That is to say, if a $H_2$ gas is introduced during the CVD film formation, the interfacial layer is converted into a manganese silicate in the process of CVD film formation. Since a self-limit phenomenon appears in the formation of a silicate, it cannot be said that the interfacial layer made up of a manganese oxide is wholly converted into a manganese silicate film. That is to say, a manganese oxide having a thickness equal to or larger than a threshold thickness cannot become a silicate and is left as a manganese oxide. If a $H_2$ gas is introduced during the post-treatment, the interfacial layer is converted into a manganese silicate in the process of post-treatment.

(4) When the introduction amount of a $H_2$ gas as a reducing gas during the CVD film formation is small or nothing, the thickness of an interfacial layer (a film composed of a manganese silicate or the like) becomes smaller. To the contrary, if the introduction amount of a $H_2$ gas during the CVD film formation is large, the thickness of an interfacial layer becomes larger.

(5) The thickness of a manganese metal film can be adjusted by the film formation time.

First Embodiment

[Manganese-Containing Film Forming Method]

Figure 2A:
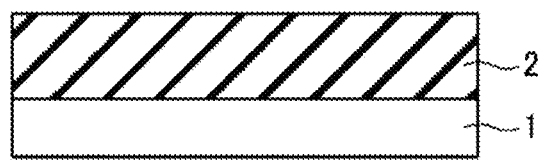
FIGS. 2A to 2C are section views showing one example in which the manganese-containing film forming method according to the first embodiment is applied to a semiconductor substrate.
Figure 2B:
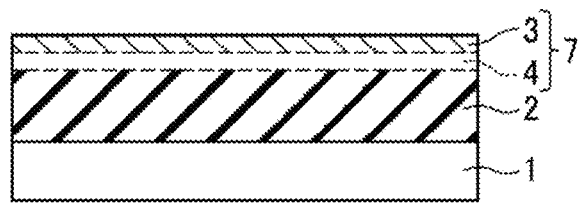
Figure 2C:
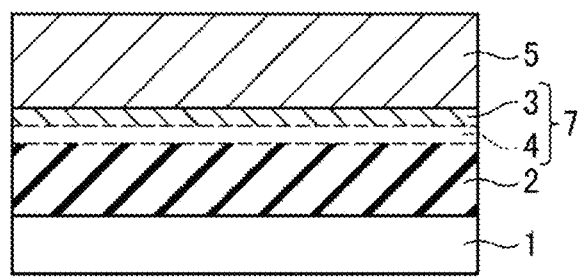

FIG. 1 is a flowchart showing one example of a manganese-containing film forming method according to a first embodiment of the present disclosure. FIGS. 2A to 2C are section views showing one example in which one example of the manganese-containing film forming method according to the first embodiment is applied to a semiconductor substrate.

(Base for the Formation of Manganese-Containing Film)

First, description will be made on a sample for the formation of a manganese-containing film. In the present embodiment, as shown in FIG. 2A, a semiconductor substrate (semiconductor wafer), on the surface of which a silicon-containing oxide film 2 containing silicon and oxygen is formed, e.g., a silicon substrate 1, is used as a base for the formation of a manganese-containing film. The silicon-containing oxide film 2 becomes an underlying layer on which a manganese metal film is formed. The silicon-containing oxide film 2 of the present embodiment is formed by a CVD method using, e.g., tetraethoxysilane (TEOS), as a source gas. The silicon-containing oxide film 2 is a film mainly composed of $SiO_2$. It is only necessary that the silicon-containing oxide film 2 contains silicon and oxygen. In addition to the film of the present embodiment mainly made up of $SiO_2$, a silicon-containing oxide film (a low-k film) which is lower in relative dielectric constant than $SiO_2$, such as a SiOC film or a SiOCH film, may be used as the silicon-containing oxide film 2. The low-k film containing silicon and oxygen may be a porous low-k film having "pores".

(Process 1: Degassing Process)

The base is subjected to a degassing process, namely process 1 shown in FIG. 1. In this process, the sample shown in FIG. 2A is heated to degas impurities such as residual moisture and the like (mainly, a part of physical adsorption water and chemical adsorption water) adsorbed to a surface of the silicon-containing oxide film 2. In order to degas the impurities such as residual moisture and the like, the degassing temperature in process 1 is set, e.g., equal to or higher than 150 degrees C. and equal to or lower than 350 degrees C. In some embodiments, the degassing temperature may be equal to or higher than 200 degrees C. and equal to or lower than 300 degrees C. One example of specific degassing conditions is as follows:

Processing atmosphere: inert gas atmosphere or forming gas atmosphere

Processing pressure: 1333 Pa (10 Torr)

Processing temperature: 300 degrees C.

Processing time: 180 seconds

One example of the inert gas is an argon (Ar) gas. One example of the forming gas is a mixture of 3% of a hydrogen ($H_2$) gas and 97% of a nitrogen ($N_2$) gas. In the forming gas, the ratio of the hydrogen gas to the nitrogen gas is not limited to 3:97. Moreover, the hydrogen may be diluted with a rare gas such as an argon gas or the like instead of the nitrogen gas.

The forming gas is not limited to the above example and may be any other gas containing at least hydrogen. If the degassing process is implemented not only to degas residual moisture but also to clean a natural oxide film of a metallic surface exposed in a pattern sample (e.g., a lower-layer copper wiring exposed on a bottom of a via-hole), the degassing process may be performed in an atmosphere containing a reducing gas such as a forming gas or the like.

Prior to depositing a manganese metal, the degassing process is performed with respect to the sample to sufficiently degas impurities such as residual moisture and the like from the surface of the silicon-containing oxide film 2 as an underlying layer. Thus, it is possible to suppress, e.g., enlargement of the variation of a thickness of a manganese metal film, which may occur due to the existence or absence of physical adsorption water or the variation of an amount of physical adsorption water (this variation depends on, e.g., the time elapsed after formation of the silicon-containing oxide film 2 or the humidity in the storage environment). It is also possible to suppress formation of a crystalline manganese oxide (which is formed by the reaction of physical adsorption water with a manganese compound gas and may deteriorate a barrier property due to the existence of a crystal grain boundary).

(Process 2: Manganese Metal Depositing Process)

Subsequently, a manganese metal deposition process, namely process 2 shown in FIG. 1, is performed. In this process, as shown in FIG. 2B, a manganese metal film 3 is formed on the silicon-containing oxide film 2. The manganese metal film 3 can be formed by a CVD method which makes use of a thermal decomposition reaction of a gas containing a manganese compound, a CVD method which makes use of a manganese-compound-containing gas and a reducing reaction gas, or an ALD method. In the present embodiment, the manganese metal film 3 is formed by depositing a manganese metal on the silicon-containing oxide film 2 through the use of a CVD method which makes use of a thermal decomposition reaction of a gas containing a manganese compound.

In process 2, the film formation temperature is set higher than the degassing temperature used in process 1 so that a film composed of a manganese silicate and/or a manganese oxide (hereinafter referred to as "manganese silicate or the like") as an interfacial layer can be reliably formed in an interface between the silicon-containing oxide film 2 and the manganese metal film 3. In addition, a reducing gas such as a hydrogen gas ($H_2$ gas) or the like is introduced in order to accelerate formation of a silicate.

If the formation temperature of the manganese metal film 3 is higher than the degassing temperature, the residual moisture (chemical adsorption water) contained within the silicon-containing oxide film 2 comes out onto the surface of the silicon-containing oxide film 2 during the film formation. Thus, the residual moisture coming out onto the surface reacts with the manganese metal film 3, whereby a manganese oxide is first formed on the interface between the silicon-containing oxide film 2 and the manganese metal film 3.

A part of this reaction remains unexplained. There is a possibility that "the residual moisture coming out onto the surface reacts with a gas containing a manganese compound, whereby a manganese oxide is first formed on the surface of the silicon-containing oxide film 2". It is considered that, if the processing temperature is equal to or higher than a silicate-forming threshold value (presumably, about 350 degrees C.), the manganese oxide is converted into a silicate by the reaction with a silicon-containing oxide of an underlying layer, whereby a manganese silicate ($MnSiO_3$ or $Mn_2SiO_4$) film is formed as an interfacial layer 4. Thus, as shown in FIG. 2B, a manganese-containing film 7 including the interfacial layer 4 composed of a manganese silicate or the like and the manganese metal film 3 not converted to a silicate is formed on the silicon-containing oxide film 2 as an underlying layer.

A manganese oxide exists in a variety of states such as $MnO$, $Mn_3O_4$, $Mn_2O_3$ and $MnO_2$. Consequently, the manganese oxide formed by the reaction with residual moisture can take a plurality of states. By introducing a reducing reaction gas such as a hydrogen gas or the like, it is possible to accelerate the formation of a silicate even with respect to already oxidized manganese such as $Mn_2O_3$ or the like.

A mechanism of accelerating the formation of a silicate by the introduction of a reducing reaction gas, e.g., hydrogen, will now be described.

First, chemical reaction formulae of a manganese oxide ($MnO$ and $Mn_2O_3$) and a silicon dioxide ($SiO_2$) are shown below. The respective chemical reaction formulae show an equilibrium state at 300K. The heat quantity of the right side means a heat quantity (kJ) per mol of manganese (Mn) and indicates the Gibbs free energy change amount (hereinafter referred to as "Gr change amount ($\Delta Gr$)"). In this regard, the Gibbs free energy tends to voluntarily decrease. Thus, a chemical reaction having a negative Gr change amount occurs voluntarily but a chemical reaction having a positive Gr change amount does not occur voluntarily. The thermodynamic database, MALT, of Kagaku Gijutsu-Sha, Japan, was used in the following thermodynamic calculation.

$$MnO + SiO_2 \rightarrow MnSiO_3 - 20.9(\Delta Gr(\text{kJ/Mn-mol})) \quad (1)$$

$$2Mn_2O_3 + 4SiO_2 \rightarrow 4MnSiO_3 + O_2 + 56.6(\Delta Gr(\text{kJ/Mn-mol})) \quad (2)$$

$$2Mn_2O_3 + 2SiO_2 \rightarrow 2Mn_2SiO_4 + O_2 + 105.4(\Delta Gr(\text{kJ/Mn-mol})) \quad (3)$$

It can be seen from chemical reaction formula (1) that, in case of $MnO$, a reaction can proceed from the left side to the right side. That is to say, it can be noted that there is a possibility of formation of a silicate. On the other hand, it can be seen from chemical reaction formulae (2) and (3) that a reaction cannot proceed from the left side to the right side. That is to say, it can be appreciated that there is no possibility of formation of a silicate. From the foregoing, it is possible to note that $Mn_2O_3$ is not converted into a silicate by merely performing a heat treatment and, therefore, $Mn_2O_3$ remains as it is.

Next, chemical reaction formulae of $Mn_2O_3$ and $SiO_2$ in the case of the introduction of hydrogen (H) are shown below.

$$Mn_2O_3 + 2SiO_2 + H_2 \rightarrow 2MnSiO_3 + H_2O - 57.6(\Delta Gr(\text{kJ/Mn-mol})) \quad (4)$$

$$Mn_2O_3 + SiO_2 + H_2 \rightarrow Mn_2SiO_4 + H_2O - 123.2(\Delta Gr(\text{kJ/Mn-mol})) \quad (5)$$

It can be seen from chemical reaction formulae (4) and (5) that in the case of the introduction of hydrogen (H), a reaction can proceed from the left side to the right side even if $Mn_2O_3$ is used. That is to say, it can be noted that there is a possibility of formation of a silicate. From the foregoing, it is possible to note that due to the introduction of hydrogen, $Mn_2O_3$ is converted into a silicate and can become $MnSi_xO_y$.

Next, chemical reaction formulae of $Mn_2O_3$ are shown below.

$$2Mn_2O_3 \rightarrow 4MnO + O_2 + 77.5(\Delta Gr(\text{kJ/Mn-mol})) \quad (6)$$

$$Mn_2O_3 + H_2 \rightarrow 2MnO + H_2O - 36.7(\Delta Gr(\text{kJ/Mn-mol})) \quad (7)$$

It can be seen from formula (6) that in the case of non-introduction of hydrogen, $Mn_2O_3$ cannot become $MnO$. As shown in formulae (2) and (3), $Mn_2O_3$ cannot be converted into a silicate without hydrogen. It is therefore possible to note that in case of non-introduction of hydrogen, $Mn_2O_3$ cannot be converted into a silicate and cannot become a manganese silicate ($MnSi_xO_y$).

It can be seen from formula (7) that due to the introduction of hydrogen, $Mn_2O_3$ can become $MnO$. As shown in formula (1), $MnO$ can be converted into a silicate and can become a manganese silicate ($MnSi_xO_y$). It is therefore possible to note that by the introduction of hydrogen, $Mn_2O_3$ can be converted into a silicate and can become a manganese silicate ($MnSi_xO_y$).

For reference, the chemical reaction formulae of $Mn_2O_3$ and $SiO2$ in the case of the introduction of oxygen (O) are considered.

$$2Mn_2O_3 + 4SiO_2 + O_2 \rightarrow 4MnSiO_3 + 2O_2 \quad (8)$$

$$2Mn_2O_3 + 2SiO_2 + O_2 \rightarrow 2Mn_2SiO_4 + 2O_2 \quad (9)$$

Chemical reaction formula (8) becomes identical to formula (2) if the oxygen (O) on both sides is cancelled. Chemical reaction formula (9) becomes identical to formula (3) if the oxygen (O) on both sides is cancelled. It can be seen from the foregoing that a reaction cannot proceed from the left side to the right side even if oxygen (O) is introduced. That is to say, it can be noted that a silicate is not formed. As described above, it is possible to note that $Mn_2O_3$ cannot be converted into a silicate by the introduction of oxygen (O) as disclosed in many prior art examples and further that a silicate cannot be formed unless annealing is performed by the introduction of hydrogen (H). While MnO and $Mn_2O_3$ are illustrated in the present embodiment by way of example, the same consideration can be given to $Mn_3O_4$ or $MnO_2$.

It is only necessary that the hydrogen annealing atmosphere contains hydrogen (H). The hydrogen concentration need not be 100%. For example, as described above, a forming gas may be used in light of the lower explosion limit of hydrogen.

The annealing temperature may be in a range of 300 to 600 degrees C. Practically, the annealing temperature may be equal to or higher than 350 degrees C. The process pressure is approximately 133 to 2670 Pa. In the case where a process is performed in a batch furnace or the like, it may be possible to use a process pressure of about 1 atm. As specific hydrogen annealing conditions, the process temperature may be, e.g., 400 degrees C., the process pressure may be, e.g., 267 Pa, and the annealing time may be, e.g., 30 minutes.

As mentioned earlier, a self-limit phenomenon appears in the formation of a silicate. Therefore, it cannot be said that the interfacial layer composed of a manganese oxide is wholly converted into a manganese silicate film. That is to say, a manganese oxide having a thickness equal to or larger than a threshold thickness cannot become a silicate and is left as a manganese oxide. The manganese oxide film and the manganese silicate film are amorphous and cannot be distinguished from each other even in a cross-sectional TEM (Transmission Electron Microscopy) photograph. For that reason, in the subject specification, the interfacial layer 4 will be referred to as a film composed of a manganese silicate or the like (a film composed of a manganese silicate and/or a manganese oxide).

One example of specific deposition conditions in process 2 is as follows:

Manganese compound: amideaminoalkane-based manganese compound
Reducing reaction gas: hydrogen gas
Processing pressure: 133 Pa (1 Torr)
Processing temperature: 350 degrees C.
Processing time: 180 seconds By forming the manganese metal film 3 under these conditions, a film composed of a manganese silicate or the like can be reliably formed as the interfacial layer 4.

If the processing time in process 2 is prolonged, e.g., from 180 seconds to 600 seconds, it becomes possible to increase the thickness of the manganese metal film 3. That is to say, the thickness of the manganese metal film 3 can be controlled by adjusting the processing time in process 2.

As a raw material of the manganese metal used in process 2, namely a manganese compound which becomes a precursor of a manganese metal, it is possible to use, e.g., a cyclopentadienyl-based manganese compound, a carbonyl-based manganese compound, a betadiketone-based manganese compound, an amidinate-based manganese compound, and an amideaminoalkane-based manganese compound. The manganese metal film 3 can be formed by selecting a gas which contains one or more of these manganese compounds.

Examples of the cyclopentadienyl-based manganese compound include bis(alkylcyclopentadienyl) manganese expressed by a chemical formula $Mn(RC_5H_4)_2$.

Examples of the carbonyl-based manganese compound include decacarbonyl 2 manganese $(Mn_2(CO)_{10})$, methyl cyclopentadienyl tricarbonyl manganese $((CH_3C_5H_4)Mn(CO)_3)$, cyclopentadienyl tricarbonyl manganese $((C_5H_5)Mn(CO)_3)$, methyl pentacarbonyl manganese $((CH_3)Mn(CO)_5)$, and 3-(t-BuAllyl)$Mn(CO)_4$.

Examples of the betadiketone-based manganese compound include bis(dipivaloylmethanato) manganese $(Mn(C_{11}H_{19}O_2)_2)$, tris(dipivaloylmethanato) manganese $(Mn(C_{11}H_{19}O_2)_3)$, bis(pentanedione) manganese $(Mn(C_5H_7O_2)_2)$, tris(pentanedione) manganese $(Mn(C_5H_7O_2)_3)$, bis(hexafluoroacetyl) manganese $(Mn(C_5HF_6O_2)_{32})$, and tris(hexafluoroacetyl) manganese $(Mn(C_5HF_6O_2)_3)$.

Examples of the amidinate-based manganese compound include bis(N,N'-dialkylacetamininate) manganese expressed by a chemical formula $Mn(R^1N\!\!-\!\!CR^3\!\!-\!\!NR^2)_2$, which is disclosed in U.S. Patent Application Publication No. 2009/0263965A1.

Examples of the amideaminoalkane-based manganese compound include bis(N,N'-1-alkylamide-2-dialkylaminoalkane) manganese expressed by a chemical formula $Mn(R^1N\!\!-\!\!Z\!\!-\!\!NR^2{}_2)_2$, which is disclosed in International Publication No. 2012/060428. In the chemical formulae noted above, "R", "$R^1$", "$R^2$" and "$R^3$" are functional groups described by $-C_nH_{2n+1}$ (where n is an integer of 0 or greater) and "Z" is a functional group described by $-C_nH_{2n}-$ (where n is an integer of 0 or greater).

Examples of the temperature for formation of the manganese metal film 3 in case of using these manganese compounds include: 250 to 300 degrees C. in case of using the amideaminoalkane-based manganese compound; 350 to 400 degrees C. in case of using the amidinate-based manganese compound; 400 to 450 degrees C. in case of using $(EtCp)_2$Mn; and 450 to 500 degrees C. in case of using MeCpMn$(CO)_3$. In short, it is only necessary that the film formation temperature be equal to or higher than the thermal decomposition temperature of a precursor. However, if a plasma CVD method is used, it is possible to form a film at a lower temperature or a temperature lower than the thermal decomposition temperature. Use of the plasma CVD method makes it possible to widen the choices of a precursor. Among the manganese compounds stated above, the amideaminoalkane-based manganese compound which makes it possible to form a film at a relatively low temperature can be used.

As the reducing reaction gas for use in reducing the manganese compounds, it is possible to use not only a hydrogen gas but also a carbon monoxide (CO) gas, an aldehyde (R—CHO) gas such as formaldehyde (HCHO) or the like, and a carboxylic acid (R—COOH) gas such as a formic acid (HCOOH) or the like. In this regard, "R" is a functional group described by $-C_nH_{2n+1}$ (where n is an integer of 0 or greater). In case of using a gas other than a hydrogen gas, it may be possible to introduce a hydrogen gas in addition to the gas.

As the method of forming the manganese metal film 3, it is possible to use not only the thermal CVD method stated above but also a PECVD (Plasma Enhanced CVD) method. In addition, it is possible to appropriately apply and use a thermal ALD method and a PEALD (Plasma Enhanced ALD) method. If a good coverage is not needed and if it is preferred that there is no underlying layer dependency, it may be possible to use a PVD (Physical Vapor Deposition) method.

After forming the manganese metal film 3 or after forming a metallic film 5 to be described later, if necessary, annealing may be performed in a reducing atmosphere. For example, annealing is performed at an annealing temperature of 350 degrees C. using a forming gas containing hydrogen (3% $H_2$+97% $N_2$) as a reducing atmosphere. In the case where the major purpose of the annealing is to convert a manganese oxide into a silicate, annealing is performed at a temperature higher than a silicate-forming threshold value (presumably, about 350 degrees C.). Examples of the reducing atmosphere used in the annealing include not only the aforementioned forming gas but also a hydrogen gas, an aldehyde (R—CHO)

gas such as formaldehyde (HCHO) or the like, and a carboxylic acid (R—COOH) gas such as a formic acid (HCOOH) or the like. In this regard, "R" is a functional group described by —$C_nH_{2n+1}$ (where n is an integer of 0 or greater).

It is sometimes the case that the reducing atmosphere does not contain hydrogen. One example of the reducing atmosphere not containing hydrogen is a carbon monoxide (CO). The annealing temperature in some embodiments is in a range of 300 to 600 degrees C. Practically, the annealing temperature may be equal to or higher than 350 degrees C. The annealing need not be necessarily performed. However, for example, if a manganese oxide is formed as the interfacial layer 4, there is a need, in some embodiments, to perform annealing in order to convert the manganese oxide into a manganese silicate. This is because the heat applied during the annealing causes a manganese oxide to react with silicon and oxygen of a silicon-containing oxide film, thereby accelerating the formation of a silicate. In this case, the annealing atmosphere may contain hydrogen in order to accelerate formation of a silicate even in the case of using an oxidized manganese oxide, e.g., $Mn_2O_3$. The mechanism of accelerating the formation of a silicate by the introduction of hydrogen is as explained above with reference to formulae (1) to (9).

(Process 3: Metal Deposition Process)

Next, a metal deposition process as process 3 shown in FIG. 1 is performed to form a metallic film 5 on the manganese metal film 3 existing at the front surface side of the manganese-containing film 7 as illustrated in FIG. 2C. As the metal deposited, it is possible to use, e.g., copper (Cu), ruthenium (Ru), cobalt (Co), or the like.

If using copper (Cu) as the metallic film 5, a copper film may be formed by a PVD method. In this case, the copper film as a whole may be formed by the PVD method. Alternatively, the copper film formed by the PVD method may be used as a plating-purpose seed layer and, by virtue of plating, another copper film may be caused to grow on the copper film formed as the plating-purpose seed layer.

Figure 3A:
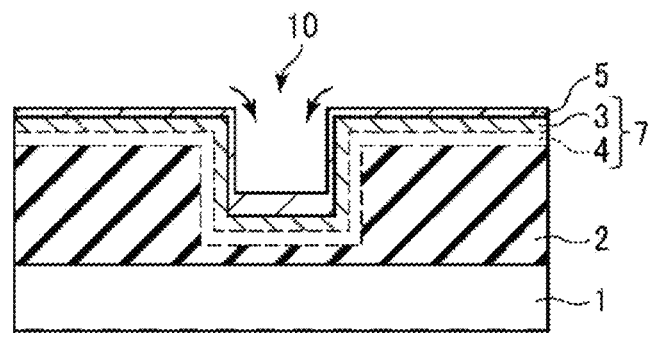
FIGS. 3A to 3C are section views showing a state in which a copper film is formed while performing a reflow.
Figure 3B:
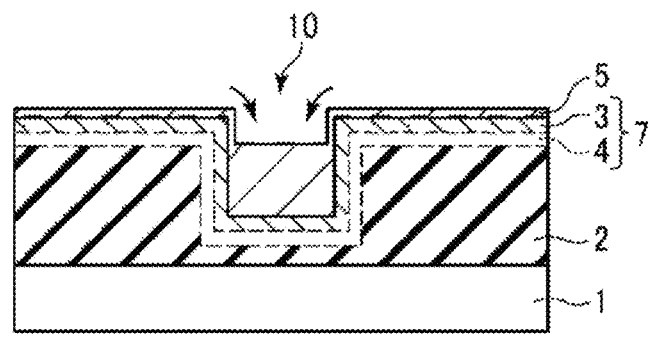
Figure 3C:
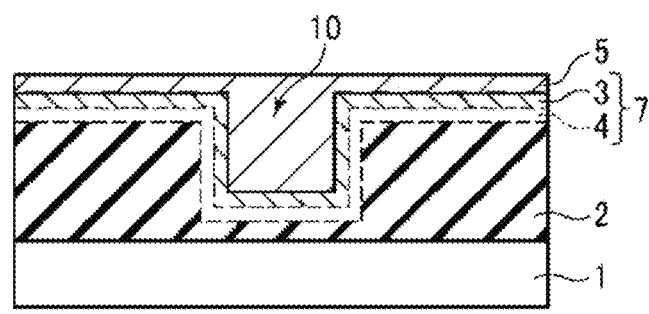

In the case of forming a copper film by a PVD method, copper may be softened by heating a substrate to a temperature of 200 to 400 degrees C., e.g., 300 degrees C. Thus, as shown in FIGS. 3A to 3C, a narrow pattern (e.g., a recess such as a trench or a via-hole) 10 may be buried with copper by a reflow. Copper becomes easy to diffuse by an assist effect attributable to the substrate heating temperature and the collision of argon (Ar) ions during a sputtering process. Therefore, as shown in FIGS. 3A to 3C, it is possible to realize a "bottom-up fill" process in which copper is filled upward from the bottom of a narrow pattern (a recess) 10. Manganese shows high wettability, adhesion and affinity with respect to copper. Even if manganese is diffused into copper, the reflow phenomenon of copper is not obstructed by manganese because the diffusion coefficient of manganese within copper is larger than the diffusion coefficient of copper within copper (the self-diffusion coefficient). From the viewpoint of burying a fine pattern with copper, it is desirable to use the reflow of copper in the present embodiment in which the manganese metal film 3 is exposed on a substrate surface.

Figure 4:
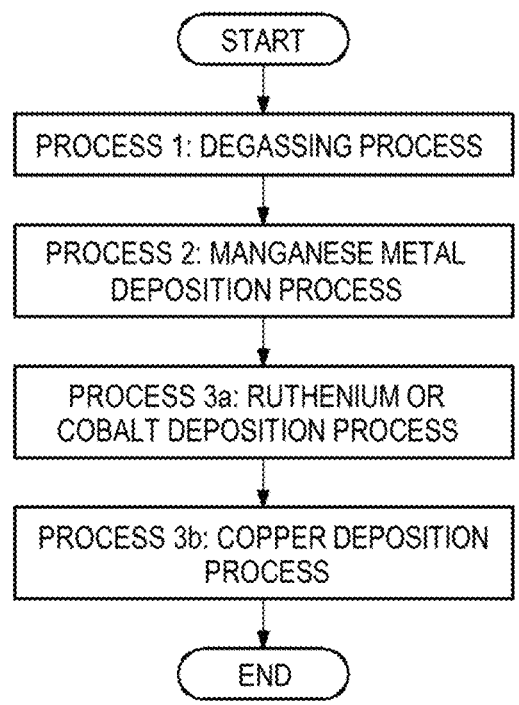
FIG. 4 is a flowchart showing another example of the manganese-containing film forming method according to the first embodiment of the present disclosure.

In the case of using ruthenium (Ru) or cobalt (Co) as the metallic film 5, a film may be formed by a CVD method. A simple substance of ruthenium or cobalt may be formed into the metallic film 5. However, as shown in the flowchart of FIG. 4, a ruthenium film or a cobalt film may be formed (process 3a) and then a copper film may be formed (process 3b). When forming the copper film, it may be possible to use a so-called direct plating method in which copper is directly plated using the ruthenium film or the cobalt film as a plating-purpose seed layer.

Furthermore, a copper film as a seed layer may be formed on a ruthenium film or a cobalt film by a PVD method and, by virtue of plating, a copper film may be caused to grow on the seed layer formed of the copper film.

In the case of forming a copper film by a PVD method, ruthenium (Ru) or cobalt (Co) shows high wettability and adhesion with respect to copper. From the viewpoint of burying a fine pattern with copper, it is desirable that the reflow of copper described with reference to FIGS. 3A to 3C is used in a state in which ruthenium (Ru) or cobalt (Co) is exposed on a substrate surface.

In the case where a copper film as a metallic film 5 is formed on a manganese metal film 3, it is considered that there is provided a layered structure in which, as shown in the section view of FIG. 2C, a silicon-containing oxide film 2, an interfacial layer 4 formed of a film of a manganese silicate or the like, a manganese metal film 3 and a metallic (Cu) film 5 are layered in the named order from below.

Figure 5A:
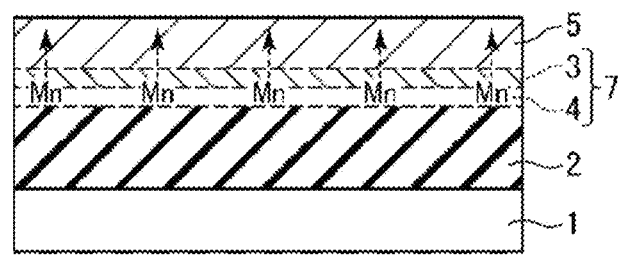
FIGS. 5A to 5C are section views showing a state in which a copper film is being formed.
Figure 5B:
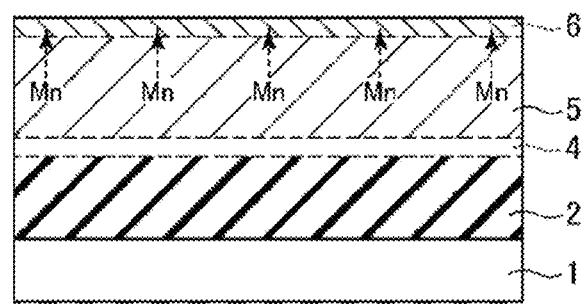
Figure 5C:
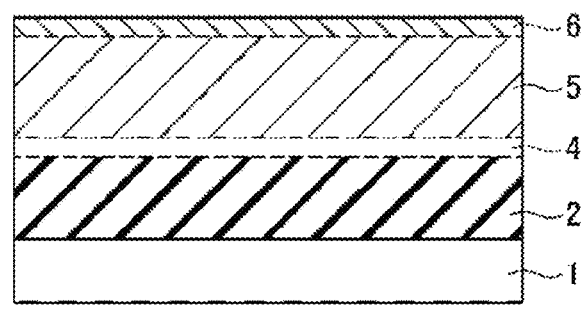

However, manganese atoms tend to diffuse within copper. Therefore, if the structure shown in FIG. 2C is thermally treated after formation of the metallic (Cu) film 5 (or while the formation of the metallic (Cu) film 5 using the reflow of copper mentioned above) as shown in the section view of FIG. 5A, manganese (Mn) constituting the manganese metal film 3 is diffused into the metallic (Cu) film 5. At last, as shown in the section view of FIG. 5B, the manganese metal film 3 disappears. Even after the manganese metal film 3 has disappeared, manganese is continuously diffused within the metallic (Cu) film 5 and is finally precipitated (segregated) on the surface of the metallic (Cu) film 5, thereby forming a manganese oxide film 6. Thus, there is provided a layered structure in which, as shown in FIG. 5C, a silicon-containing oxide film 2, an interfacial layer 4 formed of a manganese silicate film or the like, a metallic (Cu) film 5 and a manganese oxide film 6 are layered in the named order from below.

Figure 6:
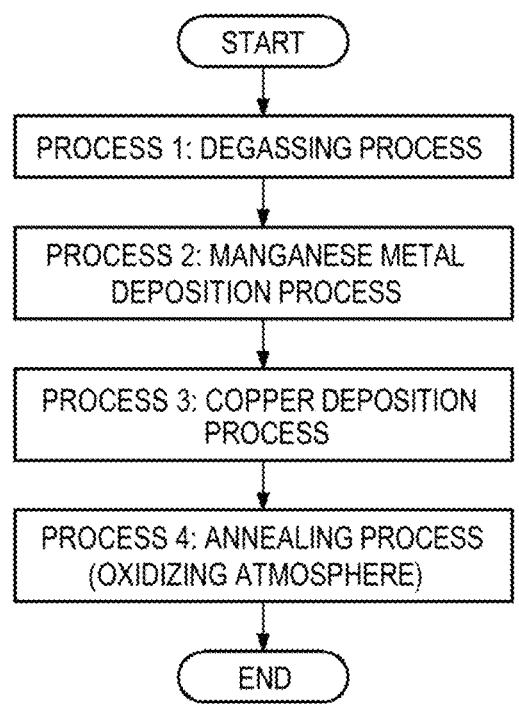
FIG. 6 is a flowchart showing still another example of the manganese-containing film forming method according to the first embodiment of the present disclosure.

In the case where process 3 is changed to a copper (Cu) deposition process as shown in the flowchart of FIG. 6 in order to accelerate the diffusion of manganese within copper and to facilitate the precipitation of surplus manganese as the manganese oxide film 6 on the surface of the metallic (Cu) film 5, process 4 may be performed after process 3. In process 4, an annealing process (e.g., at a temperature of 250 to 450 degrees C.) is performed in an oxidizing atmosphere, e.g., in an atmosphere containing a small amount (e.g., about 10 ppb) of oxygen.

With the manganese-containing film forming method according to the first embodiment, a film composed of a manganese silicate or the like, as an interfacial layer 4, can be reliably formed in an interface between a silicon-containing oxide film 2 and a metallic film 5.

[Relationship Between the Introduction Amount of a Hydrogen Gas and the Thickness of a Film Composed of a Manganese Silicate or the Like in Process 2]

Next, description will be made on the relationship between the introduction amount of a hydrogen gas and the thickness of an interfacial layer 4 in process 2.

Figure 8B:
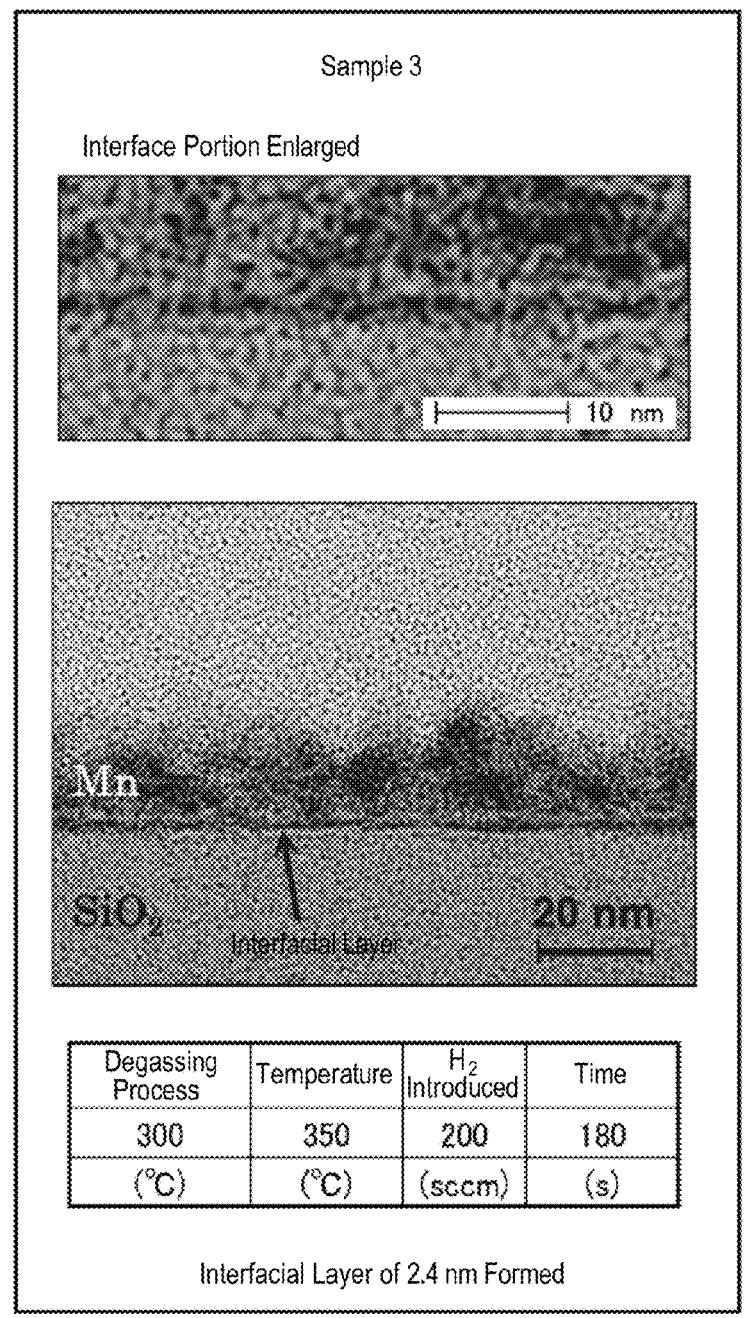
FIG. 8B is a drawing substitute photograph (a transmission electron microscope photograph) showing a cross section of sample 3 shown in FIG. 7B.
Figure 8C:
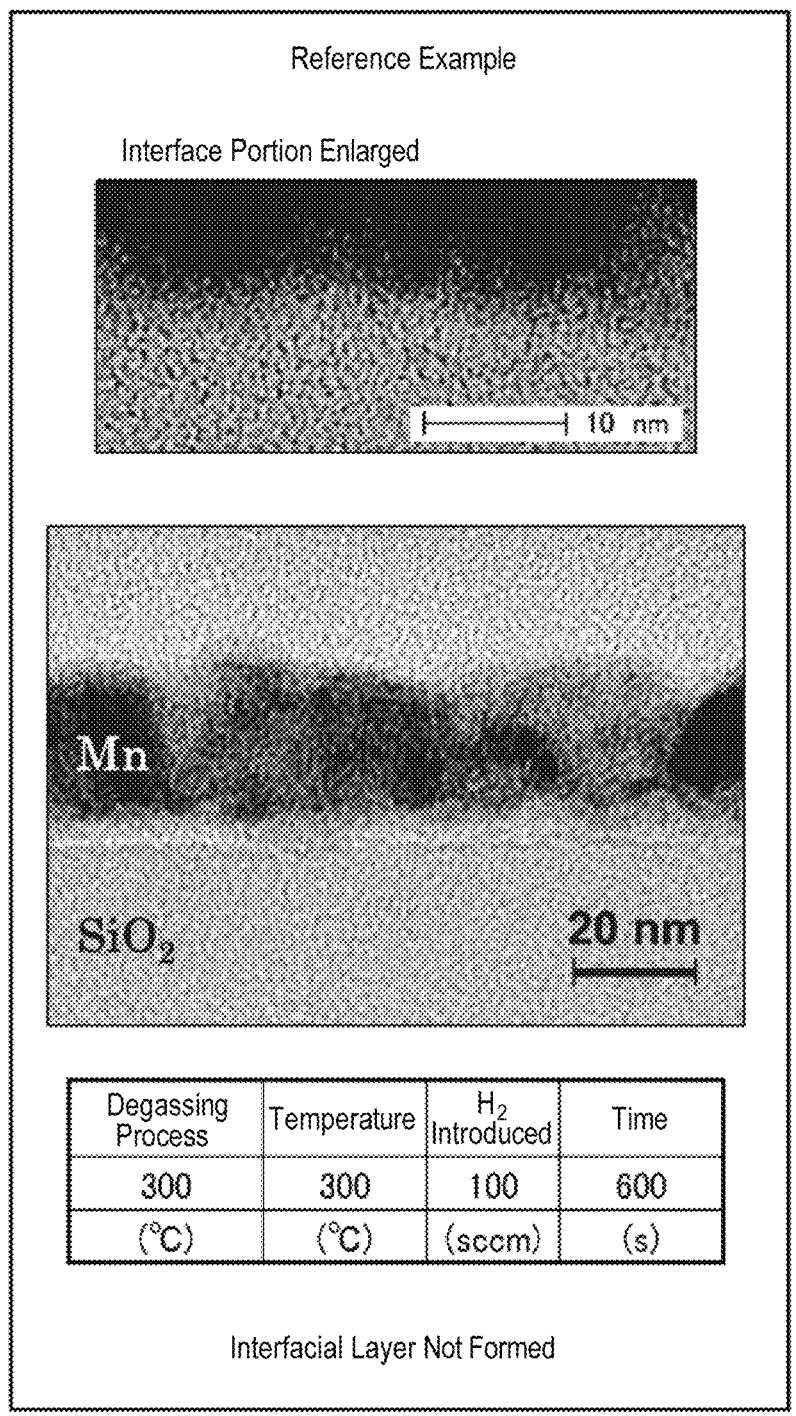
FIG. 8C is a drawing substitute photograph (a transmission electron microscope photograph) showing a cross section of the reference example shown in FIG. 7C.

FIG. 7A is a view representing the relationship between the introduction amount of a hydrogen gas and the thickness of an interfacial layer 4. FIG. 7B is a section view showing sample 1 formed at a hydrogen gas introduction amount of 0 sccm, sample 2 formed at a hydrogen gas introduction amount of 100 sccm and sample 3 formed at a hydrogen gas introduction amount of 200 sccm. FIG. 7C is a section view showing a reference example. FIG. 8A is a TEM photograph showing a cross section of sample 1. FIG. 8B is a TEM photograph showing a cross section of sample 3. FIG. 8C is a TEM photograph showing a cross section of the reference example.

In the present embodiment, the film formation conditions of process 2 remain the same as the film formation conditions described above with reference to FIG. 1, except that the hydrogen gas introduction amount is changed to 0 sccm, 100 sccm and 200 sccm.

(Sample 1: Hydrogen Gas=0 sccm)

Referring first to FIGS. 7A, 7B and 8A, when the introduction amount of a hydrogen gas is 0 sccm, namely when a hydrogen gas is not introduced, an interfacial layer 4 having a thickness of 0.8 to 1.2 nm was formed in an interface between a silicon-containing oxide film 2 and a manganese metal film 3.

(Sample 2: Hydrogen Gas=100 sccm)

Similarly, as shown in FIGS. 7A and 7B, when the introduction amount of a hydrogen gas is 100 sccm, an interfacial layer 4 having a thickness of 1.7 nm was formed in an interface between a silicon-containing oxide film 2 and a manganese metal film 3.

(Sample 3: Hydrogen Gas=200 sccm)

Similarly, as shown in FIGS. 7A, 7B and 8B, when the introduction amount of a hydrogen gas is 200 sccm, an interfacial layer 4 having a thickness of 2.4 to 2.5 nm was formed in an interface between a silicon-containing oxide film 2 and a manganese metal film 3.

In samples 2 and 3, the hydrogen gas is introduced during the film formation. Therefore, the interfacial layer 4 is converted into a silicate during the film formation. In sample 1, the hydrogen gas is not introduced during the film formation. Therefore, the interfacial layer 4 becomes a manganese oxide film during the film formation. It is presumed that, in sample 1, when annealing is performed with a forming gas after the film formation, the interfacial layer 4 is converted into a silicate (see the second embodiment to be described later). However, there is a possibility that the threshold value of formation of a silicate is as high as 350 degrees C. Therefore, there is a possibility that the formation of a silicate does not sufficiently occur in sample 1.

(Reference Example: Hydrogen Gas=100 sccm; Film Formation Temperature=300 degrees C.)

As shown in FIGS. 7C and 8C, the film formation temperature in process 2 is set at 300 degrees C. which is equal to the degassing temperature in process 1. Therefore, even if a hydrogen gas is introduced at an introduction amount of 100 sccm, an interfacial layer was not formed at all.

As described above, it was possible to obtain a result that, if the introduction amount of a hydrogen gas is increased in process 2, the thickness of the interfacial layer 4 becomes larger. As can be seen from this result, the thickness of the interfacial layer 4 formed in the interface between the silicon-containing oxide film 2 and the manganese metal film 3 can be controlled by controlling the introduction amount of the hydrogen gas introduced in process 2.

FIG. 7B shows, as a section view, the concept of deposition structures of samples 1 to 3. As shown in FIG. 7B, it is presumed that, as the hydrogen gas introduction amount is increased during the film formation, the formation of a silicate proceeds in the interfacial layer 4 composed of a manganese silicate film or the like, as a result of which the thickness of the interfacial layer 4 becomes larger. The conversion of a manganese oxide into a silicate proceeds toward a silicon-containing oxide film 2 as an underlying layer so as to corrode the silicon-containing oxide film 2. Thus, the thickness of the silicon-containing oxide film 2 tends to become smaller.

It is now assumed that MnO is converted to a silicate by reacting with $SiO_2$ of an underlying layer. MnO has a molecular weight of 71 and a density of 5.2 $g/cm^3$. $MnSiO_3$ has a molecular weight of 131 and a density of 3.7 $g/cm^3$. Therefore, if a MnO film having a thickness of 1 nm is completely converted to a silicate, a $MnSiO_3$ having a thickness of 2.6 nm is obtained. Thus, the thickness of the interfacial layer 4 becomes 2.6 times greater. This holds true in the case of other manganese oxides such as $Mn_2O_3$ and the like. That is to say, in other manganese oxides, the thickness of the interfacial layer 4 is also increased by the conversion into a silicate.

In the present embodiment, the hydrogen gas introduction does not make direct contribution to a CVD film formation reaction. It is therefore considered that the thickness of the manganese metal film 3 shows little change in samples 1 to 3.

As described above, with the manganese-containing film forming method according to the first embodiment, a gas containing a manganese oxide and a reducing reaction gas (a hydrogen gas) are used as the film formation gases used in process 2 (the manganese metal deposition process). Furthermore, the film formation temperature in process 2 is set higher than the degassing temperature in process 1 (the degassing process). By the provision of this configuration, it is possible to obtain an advantage in that a film composed of a manganese silicate or the like, as an interfacial layer 4, can be reliably formed between a manganese metal film 3 and an underlying layer (a silicon-containing oxide film 2) containing silicon and oxygen.

Moreover, the thickness of an interfacial layer 4 composed of a manganese silicate film or the like and formed in an interface between a silicon-containing oxide film 2 and a manganese metal film 3 can be controlled by controlling the amount of a reducing reaction gas, e.g., a hydrogen gas, introduced in process 2.

In a semiconductor integrated circuit device using a copper wiring, a barrier film configured to suppress diffusion of copper is arranged around the copper wiring. The barrier film, if too thick, tends to reduce the cross-sectional area of, e.g., a via-hole or a trench in which the copper wiring is formed, thereby increasing the resistance value of the copper wiring. For that reason, there is a demand for making the barrier film as thin as possible. However, if the barrier film is too thin, a tradeoff problem is posed in that the barrier property is lowered.

Under these circumstances, in the manganese-containing film 7 including the interfacial layer 4 composed of a manganese silicate film or the like, which is formed according to one example of the first embodiment, the film composed of a manganese silicate or the like constituting the interfacial layer 4 is in an amorphous state and is dense. Thus, no crystal grain boundary exists in the film. This makes it possible to realize a continuous barrier film which shows a high barrier property in spite of the reduced thickness.

A manganese silicate film is formed into a self-formed barrier by the reaction with the silicon-containing oxide film 2 as an underlying layer. For that reason, most portions of the manganese silicate film can be formed at the side of the underlying layer. This provides an advantage in that it is hard to reduce the barrier cross-sectional area of a via-hole or a trench. For that reason, the manganese-containing film 7 formed according to the first embodiment is very useful in forming a barrier film for a semiconductor integrated circuit device which makes use of copper as a wiring-purpose conductive metal.

In the case of using a ruthenium (Ru) film or a cobalt (Co) film as a metallic film, a copper film is used as a seed layer and a copper wiring is formed on the seed layer by a plating method. In this case, ruthenium (Ru) or cobalt (Co) is formed into a liner film on the entire surface. Ruthenium (Ru) or cobalt (Co) is highly conductive but is higher in resistance value than copper. For that reason, the ruthenium (Ru) film or the cobalt (Co) film increases the resistance value of a copper wiring. Furthermore, the liner film made of ruthenium (Ru) or cobalt (Co) reduces the original cross-sectional area of a via-hole or a trench. However, as mentioned above, in the manganese-containing film forming method according to the first embodiment, it is hard to reduce the original cross-sectional area of, e.g., a via-hole or a trench. Thus, the manganese-containing film forming method according to the first embodiment is useful in forming a layered structure of a barrier film and a ruthenium (Ru) film or a cobalt (Co) film.

As described in, e.g., JP2011-134317A, the ease of deposition of a Ru film in a ruthenium (Ru)-CVD process varies depending on whether the surface of an underlying layer is a metal or an oxide (the incubation time for Ru film formation is shortened on the metal). Therefore, if the first embodiment in which a manganese metal film 3 is formed on a substrate surface is applied, the CVD-ruthenium film deposited on the manganese metal film 3 is formed within a short incubation time. This is desirable from the viewpoint of productivity.

The manganese-containing film forming method according to the first embodiment can additionally provide the following effects.

(1) As described above, the film composed of a manganese silicate or the like, which constitutes the interfacial layer 4, is amorphous and, therefore, has no crystal grain boundary. Thus, as compared with a barrier film having a crystal grain boundary, it is possible to improve a barrier property that suppresses the diffusion of a conductive metal of an electronic device, e.g., a semiconductor device, in an inter-layer insulating film, e.g., the diffusion of copper in an inter-layer insulating film. Furthermore, the film composed of a manganese silicate or the like serves to prevent moisture or oxygen contained in an inter-layer insulating film from diffusing toward a wiring and oxidizing or corroding a conductive metal of a semiconductor device (e.g., copper of a wiring or Ta of a barrier film).

(2) The manganese silicate which constitutes the interfacial layer 4 reacts with a silicon-containing oxide film as an underlying layer and serves as a self-formed barrier. Therefore, most portions of the manganese silicate are formed at the side of an underlying layer. The thickness of the silicon-containing oxide film 2 becomes smaller when converted into a silicate than when not converted into a silicate. Thus, as described above, the silicon-containing oxide film 2 can approach a "zero-thickness barrier" as compared with a case where the silicon-containing oxide film 2 is not converted into a silicate. It is therefore possible to suppress the reduction of an original cross-sectional area of a via-hole or a trench. This is advantageous in reducing the resistance of a metal wiring embedded in a via-hole or a trench.

(3) A manganese oxide exists in a variety of states such as MnO, $Mn_3O_4$, $Mn_2O_3$ and $MnO_2$. Consequently, the valence of manganese can take a plurality of states from bivalence to tetravalence. The density or volume of a manganese oxide may possibly be changed depending on the aforementioned states. However, once a manganese silicate ($MnSiO_3$ or $Mn_2SiO_4$) is formed, the state thereof becomes more stable than the state of a manganese oxide. Thus, the post-manufacture aged deterioration of an electronic device, e.g., a semiconductor device, is reduced.

(4) The manganese-containing film 7 includes the interfacial layer 4 composed of a manganese silicate film or the like and formed in the interface with the silicon-containing oxide film 2 as an underlying layer and the manganese metal film 3 formed on the interfacial layer 4. Therefore, if a metallic film 5, e.g., a copper film, is formed on the manganese-containing film 7, a metal-to-metal joint is obtained. It is therefore possible to enhance the adhesion of the interfacial layer 4 and the metallic (Cu) film 5 as compared with a case where the metallic (Cu) film 5 is directly formed on a manganese silicate film or the like.

It can be said that the manganese silicate which constitutes the interfacial layer 4 is a material more stable than a manganese oxide. For that reason, it can be said that the manganese silicate is a material which is more difficult to adhere to other adjoining material than a manganese oxide.

In the first embodiment, the film composed of a manganese silicate or the like and formed as the interfacial layer 4 is obtained by oxidizing the interface portion of the manganese metal film 3 and/or converting the interface portion of the manganese metal film 3 into a silicate. The interfacial layer 4 and the manganese metal film 3 existing on the interfacial layer 4 are originally formed into a one-piece film.

Moreover, manganese tends to diffuse into, e.g., copper. Therefore, if the metallic (Cu) film 5 is formed on the manganese metal film 3, manganese atoms are diffused into the metallic (Cu) film 5 during the formation of the metallic (Cu) film 5 (in case of using a reflow) and/or during the heat treatment performed after the formation of the metallic (Cu) film 5. As the diffusion proceeds, the manganese metal film 3 disappears. As a result of disappearance of the manganese metal film 3, the metallic (Cu) film 5 adjoins the interfacial layer 4, which is originally one-piece formed with the manganese metal film 3, while forming a continuous and transitive region. This phenomenon is an atom-level phenomenon which occurs when at least manganese atoms move within the metallic (Cu) film 5 during or after film formation. Thus, the adhesion in a joint section of the metallic (Cu) film 5 and the interfacial layer 4 becomes stronger.

From this viewpoint, if the manganese-containing film 7 has a structure in which the manganese metal film 3 is formed on the interfacial layer 4 composed of a manganese silicate film or the like, it is possible to improve the adhesion of the manganese-containing film 7 to the metallic film 5 formed thereon.

In particular, the improvement of adhesion between the film composed of a manganese silicate or the like, which constitutes a barrier film, and the conductive metal, e.g., copper, which constitutes a metal wiring formed on the barrier film makes it possible to enhance a stress migration resistance (an SM resistance). This is advantageous in prolonging the lifespan of an electronic device, e.g., a semiconductor integrated circuit device.

The metallic (Cu) film 5 into which manganese atoms are diffused is an alloy of copper and manganese. As described above, the manganese atoms diffused into the metallic (Cu) film 5 can be removed from the metallic (Cu) film 5, e.g., by a heat treatment performed during and/or after the formation of the metallic (Cu) film 5. This makes it possible to return the metallic (Cu) film 5 to a substantially pure metallic (Cu) film 5. Therefore, even if manganese atoms are diffused into the metallic (Cu) film 5, it is possible to substantially eliminate adverse effects such as an increase in a physical resistance value, e.g., a sheet resistance, of the metallic (Cu) film 5.

If manganese atoms are diffused into the metallic (Cu) film 5 and if a small amount of manganese atoms remain in the peripheral edge portion of a copper wiring, it is possible to enhance an electro-migration resistance (an EM resistance). This is advantageous in prolonging the lifespan of an electronic device, e.g., a semiconductor integrated circuit device. A film (such as SiN, SiC or SiCN) serving as a copper barrier and an etching stopper is formed on a copper wiring. In order to secure adhesion between the copper wiring and the barrier film such as SiCN or the like to thereby enhance the wiring reliability, a cap layer composed of diffused manganese may be formed on the copper wiring.

The first embodiment can be effectively applied to a method for manufacturing an electronic device which includes an interfacial layer composed of a manganese silicate film or the like, e.g., a method for manufacturing a semiconductor integrated circuit device. For example, if the interfacial layer included in an electronic device is formed according to the first embodiment, the effects described in the foregoing embodiment can be obtained in a method for manufacturing an electronic device, e.g., a semiconductor integrated circuit device.

If the electronic device is a semiconductor integrated circuit device, one example of the aforementioned interfacial layer may be a barrier film which is formed between a metal wiring existing within the semiconductor integrated circuit device and an inter-layer insulating film and which is configured to suppress diffusion of a metal contained in the metal wiring.

Examples of a conductive metal which constitutes the conductive metal wiring include copper, ruthenium and cobalt. The conductive metal may include two or more elements selected form the group consisting of these three conductive metals.

A PVD method may also be used, e.g., a method in which a self-formed barrier containing a manganese oxide or a manganese silicate is formed by sputtering a copper-manganese (CuMn) alloy target and forming a copper-manganese alloy film on an underlying layer. However, in this method of forming the copper-manganese alloy film, it is hard to obtain desirable step coverage and it is difficult to bury a narrow pattern.

In contrast, according to the first embodiment, namely a method in which a self-formed barrier containing a manganese oxide or a manganese silicate is formed by forming a manganese metal film on an underlying layer by a CVD method, it is possible to perform the aforementioned reflow of copper, e.g., during the formation of a copper film. This makes it possible to reliably bury a narrow pattern. As compared with a method in which a copper-manganese alloy film is formed on an underlying layer by sputtering a copper-manganese alloy target, the present embodiment is advantageous in manufacturing an electronic device, e.g., a semiconductor integrated circuit device, which has a fine and narrow pattern.

As for the film formation temperature, the film formation temperature is room temperature in the case of the PVD method while the film formation temperature is equal to or higher than a decomposition temperature of a precursor in the CVD method. As for the supply of manganese, manganese atoms are supplied in the case of the PVD method while organic metal complex molecules are supplied in the case of the CVD method.

In other words, the manganese-containing film forming method using a CVD method, which has been described above in respect of the first embodiment, is a technology not suggested by, but clearly distinguished from, a manganese-containing film forming method using a PVD method.

Second Embodiment

[Manganese-Containing Film Forming Method]

In the first embodiment described above, a reducing reaction gas, e.g., a hydrogen gas, is introduced in the manganese metal deposition process (process 2). However, the second embodiment is directed to an example in which an interfacial layer 4 made up of a manganese silicate or the like is formed in an interface between a silicon-containing oxide film 2 and a manganese metal film 3 without introducing a reducing reaction gas in the manganese metal deposition process (process 2).

Figure 9:
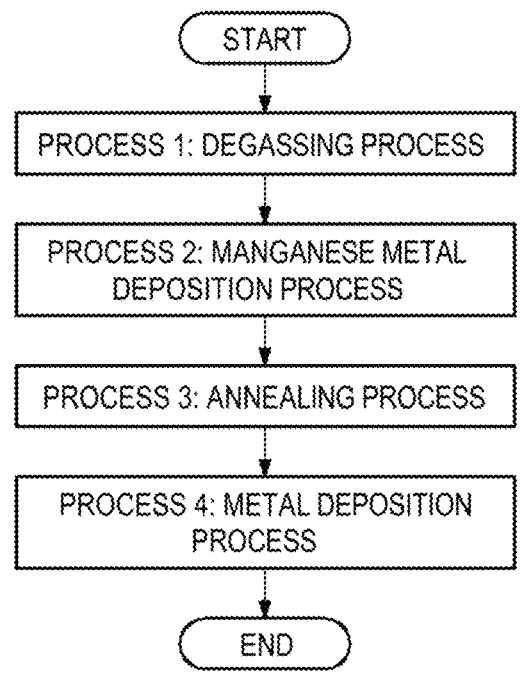
FIG. 9 is a flowchart showing one example of a manganese-containing film forming method according to a second embodiment of the present disclosure.

FIG. 9 is a flowchart showing one example of a manganese-containing film forming method according to a second embodiment of the present disclosure.

As shown in FIG. 9, the second embodiment differs from the first embodiment shown in FIG. 1 in that a reducing reaction gas is not introduced in the manganese metal deposition process (process 2) and an annealing process (process 3) as an essential process is performed in a reducing gas atmosphere after the manganese metal deposition process (process 2). The metal deposition process was process 3 in the first embodiment. In the second embodiment, the metal deposition process is process 4 and is performed after the annealing process (process 3).

(Process 1: Degassing Process)

A degassing process as process 1 in FIG. 9 is performed in the same manner as in the first embodiment with respect to the base shown in FIG. 2A. One example of specific degassing conditions is as follows:

Processing atmosphere: inert gas atmosphere or forming gas atmosphere
Processing pressure: 1333 Pa (10 Torr)
Processing temperature: 300 degrees C.
Processing time: 180 seconds (Process 2: Manganese Metal Deposition Process)

Next, a manganese metal deposition process as process 2 in FIG. 9 is performed. This process is performed using the same manganese compounds as used in the first embodiment. However, unlike the first embodiment, this process does not use a reducing reaction gas such as a hydrogen gas ($H_2$ gas) or the like.

Just like the first embodiment, the film formation temperature is set higher than the degassing temperature used in process 1. If the formation temperature of the manganese metal film is higher than the degassing temperature, the residual moisture (chemical adsorption water) contained within the silicon-containing oxide film 2 comes out onto the surface of the silicon-containing oxide film 2 during the film formation. Thus, the residual moisture coming out onto the surface reacts with the manganese metal film, whereby a manganese oxide is first formed on the interface between the silicon-containing oxide film 2 and the manganese metal film 3.

As in the first embodiment, a part of this reaction remains unexplained. There is a possibility that "the residual moisture coming out onto the surface reacts with a gas containing a manganese compound, whereby a manganese oxide is first formed on the surface of the silicon-containing oxide film 2". It is considered that, if the processing temperature is equal to or higher than a silicate-forming threshold value (presumably, about 350 degrees C.), the manganese oxide is converted into a silicate by the reaction with a silicon-containing oxide of an underlying layer, whereby a manganese silicate (Mn-$SiO_3$ or $Mn_2SiO_4$) film is formed as an interfacial layer 4. Since a reducing reaction gas such as a hydrogen gas or the like is not supplied during the film formation, the oxidized manganese such as $Mn_2O_3$ or the like is not converted to a silicate in this process.

One example of specific deposition conditions is as follows:

Manganese compound: amideaminoalkane-based manganese compound
  Reducing reaction gas: not supplied
  Processing pressure: 133 Pa (1 Torr)
  Processing temperature: 350 degrees C.
  Processing time: 180 seconds
(Process 3: Annealing Process)

Next, an annealing process as process 3 in FIG. 9 is performed. This annealing process is performed in a reducing atmosphere created by supplying a reducing gas, thereby converting the manganese oxide film formed between the silicon-containing oxide film 2 and the manganese metal film into a silicate in an accelerated manner. A hydrogen gas can be used as the reducing gas for performing the annealing process. Other examples of the reducing gas include an aldehyde (R—CHO) gas such as formaldehyde (HCHO) or the like, and a carboxylic acid (R—COOH) gas such as a formic acid (HCOOH) or the like. In this regard, "R" is a functional group described by —$C_nH_{2n+1}$ (where n is an integer of 0 or greater). It may be possible to use a reducing gas not containing hydrogen, such as a carbon monoxide (CO) gas or the like. An atmosphere containing a hydrogen gas, e.g., a forming gas (of 3% $H_2$+97% $N_2$), can be used as the reducing atmosphere. A hydrogen gas atmosphere and an atmosphere of other reducing gases mentioned above may be used independently or in combination as the reducing atmosphere.

This annealing process is performed in order to convert the manganese oxide film into a silicate and, therefore, needs to be performed at a temperature at which a silicate can be formed. Since a threshold value for converting the manganese oxide film into a silicate is presumed to be about 350 degrees C., the annealing process may be performed at a temperature of 350 degrees C. or higher.

One example of specific annealing conditions is as follows:
  Reducing reaction gas: forming gas (3% hydrogen gas+97% nitrogen gas)
  Processing pressure: 1333 Pa (10 Torr)
  Processing temperature: 350 degrees C.
  Processing time: 600 seconds
(Process 4: Metal Deposition Process)

Next, a metal deposition process as process 4 in FIG. 9 is performed. Deposition conditions in process 4 are identical with the deposition conditions used in process 3 of the first embodiment.

As described above, according to the second embodiment, a manganese oxide film is formed in the interface between the silicon-containing oxide film 2 and the manganese metal film 3 by setting the formation temperature of the manganese metal film 3 higher than the degassing temperature. Thereafter, annealing for the formation of a silicate is performed in a reducing atmosphere while supplying a reducing gas such as a hydrogen gas or the like. As a result, the manganese oxide film existing in the interface is converted into a film composed of a manganese silicate or the like. Just like the first embodiment, it is therefore possible to form a manganese-containing film which includes an interfacial layer composed of a manganese silicate or the like and a manganese metal film formed on the interfacial layer.

Third Embodiment

Next, a processing system capable of carrying out the manganese-containing film forming methods according to the first and second embodiments will be described as a third embodiment of the present disclosure.

<First System Configuration Example>

Figure 10:
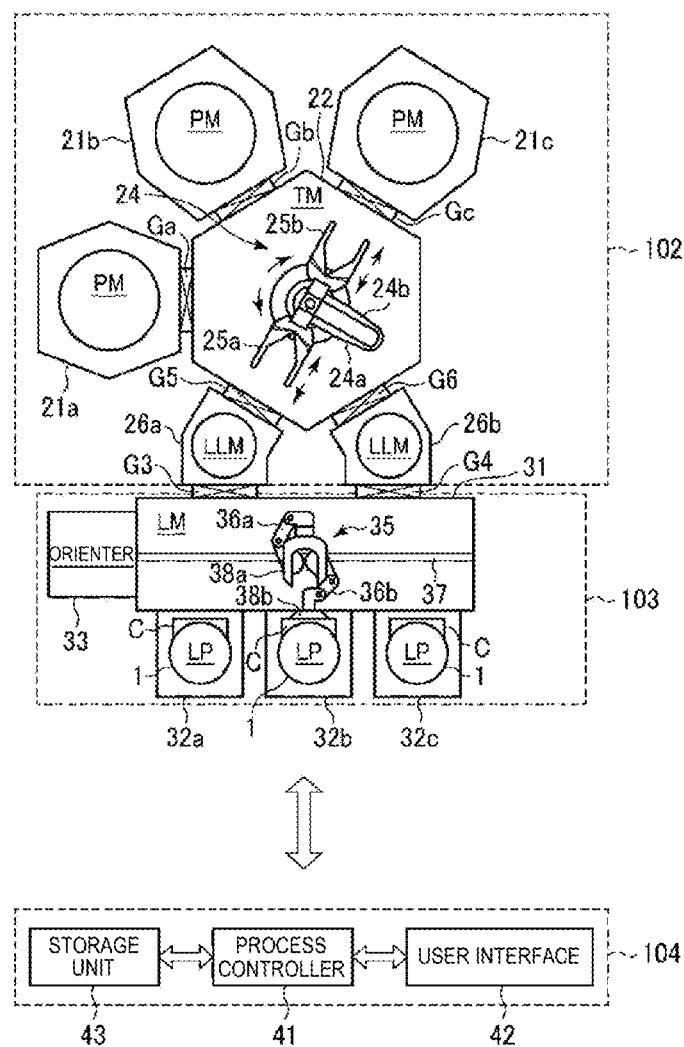
FIG. 10 is a top view showing one example of a first system configuration example of a processing system capable of carrying out the manganese-containing film forming methods according to the first and second embodiments of the present disclosure.

FIG. 10 is a top view showing a first system configuration example of a processing system capable of carrying out the manganese-containing film forming methods according to the first and second embodiments of the present disclosure.

As shown in FIG. 10, a first processing system 101 includes a processing part 102 configured to perform a process with respect to a silicon substrate 1, a transfer part 103 configured to load and unload the silicon substrate 1 out of and into the processing part 102, and a control part 104 configured to control the processing system 101. The processing system 101 of the present example is a cluster-tool-type (multi-chamber-type) semiconductor manufacturing apparatus.

The manganese-containing film forming method according to the first embodiment of the present disclosure includes three major processes, namely processes 1 to 3, as shown in FIG. 1. Therefore, in the first processing system 101, three processing units 21a to 21c configured to respectively perform the three major processes are arranged around, e.g., a single transfer chamber (TM: Transfer Module) 22. More specifically, the processing part 102 includes the processing units (PM: Process Modules) 21a to 21c serving as processing modules for carrying out different processes. Each of the processing units 21a to 21c includes a processing chamber configured to depressurize the inside thereof to a predetermined vacuum degree and perform therein one of processes 1 to 3 mentioned above.

The processing unit 21a is a degassing unit configured to perform process 1. The processing unit 21a performs a degassing process with respect to a processing target, e.g., a silicon substrate 1 having the silicon-containing oxide film 2 formed on the surface thereof. The processing unit 21b is a manganese metal deposition unit configured to perform process 2. The processing unit 21b forms a manganese metal film 3 on the silicon-containing oxide film 2 subjected to the degassing process. The processing unit 21c is a metal deposition unit configured to perform process 3. The processing unit 21c forms a film containing a conductive metal, e.g., copper, ruthenium or cobalt, on the silicon substrate 1 on which the manganese metal film 3 is formed. These processing units 21a to 21c are connected to a transfer chamber 22 through gate valves Ga to Gc.

The transfer part 103 includes a transfer chamber (LM: Loader Module) 31. The transfer chamber 31 is configured to regulate the internal pressure thereof to an atmospheric pressure or a substantially atmospheric pressure, e.g., to a pressure a little higher than the ambient atmospheric pressure. In the present example, the transfer chamber 31 is a rectangle, when viewed from the top, having long sides and short sides orthogonal to the long sides. One of the long sides of the rectangle adjoins the processing part 102. The transfer chamber 31 includes load ports (LP) in which target substrate carriers C accommodating the silicon substrates 1 are installed. In the present example, three load ports 32a to 32c are installed on another long side of the transfer chamber 31 opposite the long side facing the processing unit 102. However, the number of load ports is not limited thereto but may be arbitrary. Shutters not shown are respectively installed in the load ports 32a to 32c. If the carriers C accommodating the silicon substrates 1 or the empty carriers C are installed in the load ports 32a to 32c, the shutters not shown are opened to allow the inside of the carriers C and the inside of the transfer chamber 31 to communicate with each other while preventing infiltration of the ambient air. An orienter 33 configured to perform alignment of the positions of notches formed in the silicon substrates 1 is installed in one of the short sides of the transfer chamber 31.

At least one load-lock chamber (LLM: Load-Lock Module), e.g., two load-lock chambers 26a and 26b in the present example, is installed between the processing part 102 and the transfer part 103. Each of the load-lock chambers 26a and 26b is configured to switch the internal pressure thereof to a predetermined vacuum degree and an atmospheric pressure or a substantially atmospheric pressure. The load-lock chambers 26a and 26b are respectively connected through gate valves G3 and G4 to one side of the transfer chamber 31 opposite to the side on which the load ports 32a to 32c are installed. The load-lock chambers 26a and 26b are also respectively connected through gate valves G5 and G6 to two sides of the transfer chamber 22 other than three sides to which the processing units 21a to 21c are connected. The load-lock chambers 26a and 26b are brought into communication with the transfer chamber 31 by opening the corresponding gate valves G3 and G, and are disconnected from the transfer chamber 31 by closing the corresponding gate valves G3 and G4. Furthermore, the load-lock chambers 26a and 26b are brought into communication with the transfer chamber 22 by opening the corresponding gate valves G5 and G6 and are disconnected from the transfer chamber 22 by closing the corresponding gate valves G5 and G6.

A transfer mechanism 35 is installed within the transfer chamber 31. The transfer mechanism 35 performs transfer of the silicon substrates 1 with respect to the target substrate carriers C. In addition, the transfer mechanism 35 performs transfer of the silicon substrates 1 with respect to the orienter 33 and transfer of the silicon substrates 1 with respect to the load-lock chambers 26a and 26b. The transfer mechanism 35 includes, e.g., two multi-joint arms 36a and 36b, and is configured to move along a rail 37 extending in a longitudinal direction of the transfer chamber 31. Hands 38a and 38b are installed at the tip ends of the multi-joint arms 36a and 36b, respectively. The transfer of the silicon substrate 1 is performed while the silicon substrate 1 is placed on the hand 38a or 38b.

The transfer chamber 22 is configured to be vacuum maintainable, e.g., a vacuum container. A transfer mechanism 24 configured to perform transfer of the silicon substrate 1 between the processing units 21a to 21c and the load-lock chambers 26a and 26b is installed within the transfer chamber 22. Thus, the silicon substrate 1 is transferred in a state where the silicon substrate 1 is isolated from the atmosphere. The transfer mechanism 24 is arranged substantially at the center of the transfer chamber 22. The transfer mechanism 24 includes, e.g., a plurality of rotatable and extendible transfer arms. In the present example, the transfer mechanism 24 includes, e.g., two transfer arms 24a and 24b. Holders 25a and 25b are installed at the tip ends of the transfer arms 24a and 24b, respectively. The transfer of the silicon substrate 1 between the processing units 21a to 21c and the load-lock chambers 26a and 26b as mentioned above is performed while the silicon substrate 1 is held by the holder 25a or 25b.

The control part 104 includes a process controller 41, a user interface 42 and a storage unit 43. The process controller 41 is formed of a microprocessor (computer). The user interface 42 includes a keyboard through which an operator performs a command input operation or other operations to manage the processing system 101, a display configured to visually display the operation situation of the processing system 101, and so forth. The storage unit 43 stores a control program for realizing the processes carried out in the processing system 101 under the control of the process controller 41, various types of data, and recipes for causing the processing system 101 to execute processes pursuant to processing conditions. The recipes are stored in a storage medium of the storage unit 43. The storage medium, which is computer-readable, may be, e.g., a hard disk or a portable storage medium such as a CD-ROM, a DVD, a flash memory or the like. Alternatively, recipes may be appropriately transmitted from other devices via, e.g., a dedicated line. In response to an instruction sent from the user interface 42, at least one recipe is called out from the storage unit 43 and is executed by the process controller 41. Thus, under the control of the process controller 41, the manganese-containing film forming methods according to the first and second embodiments are carried out with respect to the silicon substrate 1.

The annealing process as process 3 in FIG. 9 performed after the manganese metal deposition process (process 2) can be performed by, e.g., the processing unit 21c which performs process 2 shown in FIG. 1 or the metal deposition process as process 4 shown in FIG. 9. The annealing process (process 4 in FIG. 6) optionally performed in an oxidizing atmosphere when process 3 is a copper (Cu) deposition process as shown in FIG. 6, can be performed by the processing unit 21c which performs, e.g., a metal deposition process.

Figure 11:
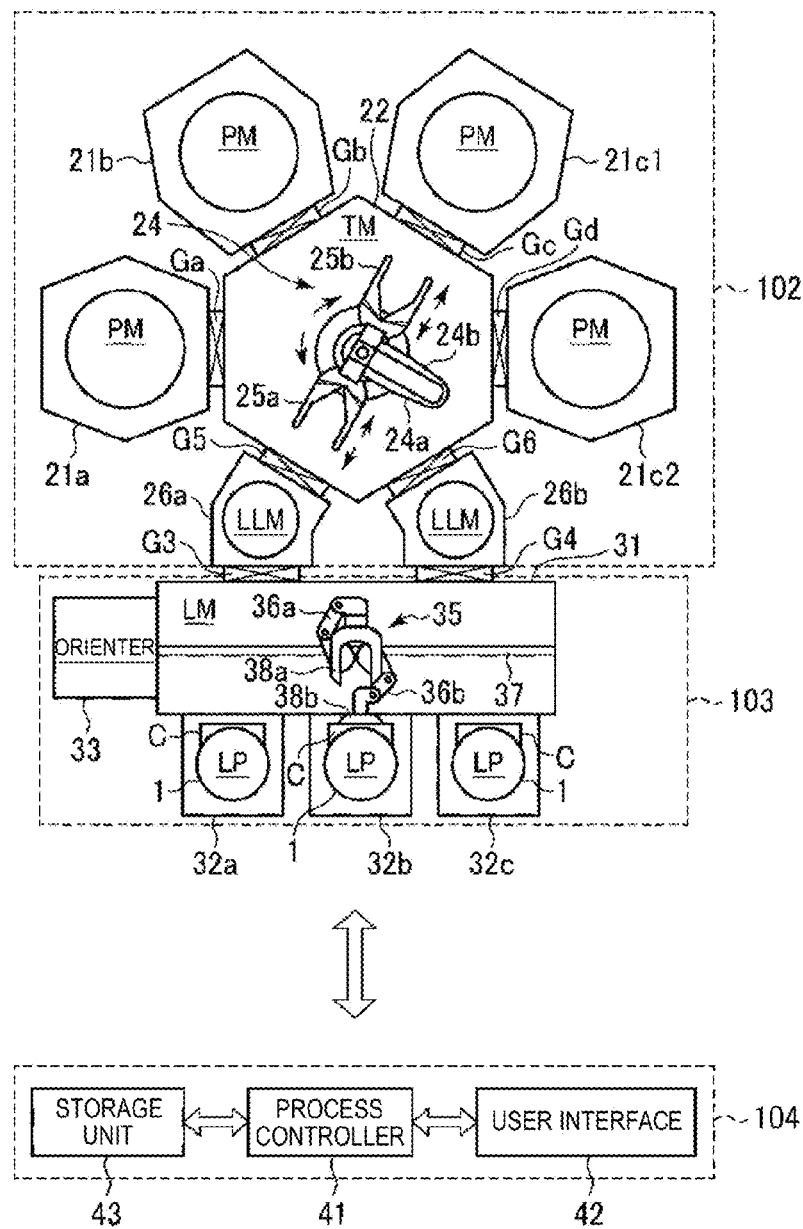
FIG. 11 is a top view showing another example of the first system configuration example of the processing system capable of carrying out the manganese-containing film forming methods according to the first and second embodiments of the present disclosure.

FIG. 11 is a top view showing another example of the first system configuration example of the processing system capable of carrying out the manganese-containing film forming methods according to the first and second embodiments of the present disclosure.

As shown in FIG. 11, in the first system configuration example, the processing unit 21c configured to perform the metal deposition process may be divided into two processing units 21c1 and 21c2.

The processing unit 21c1 shown in FIG. 11 is, e.g., a metal deposition unit configured to perform a part of process 3 shown in FIG. 1. The processing unit 21c1 forms a film containing a conductive metal, e.g., ruthenium or cobalt, on the silicon substrate 1 on which the manganese metal film 3 is formed. That is to say, the processing unit 21c1 performs, e.g., process 3a shown in FIG. 4.

The processing unit 21c2 is, e.g., a metal deposition unit configured to perform a part of process 3 shown in FIG. 1. The processing unit 21c2 forms a film containing a conductive metal, e.g., copper, on the silicon substrate 1 on which the film containing ruthenium or cobalt is formed. That is to say, the processing unit 21c2 performs, e.g., process 3b shown in FIG. 4.

As described above, in case of forming plural types of metallic films, the metal deposition unit may be divided into plural ones depending on, e.g., the types of the metallic films.

The manganese-containing film forming methods according to the first and second embodiments can be carried out by the processing systems shown in FIGS. 10 and 11.

<Second System Configuration Example>

Figure 12:
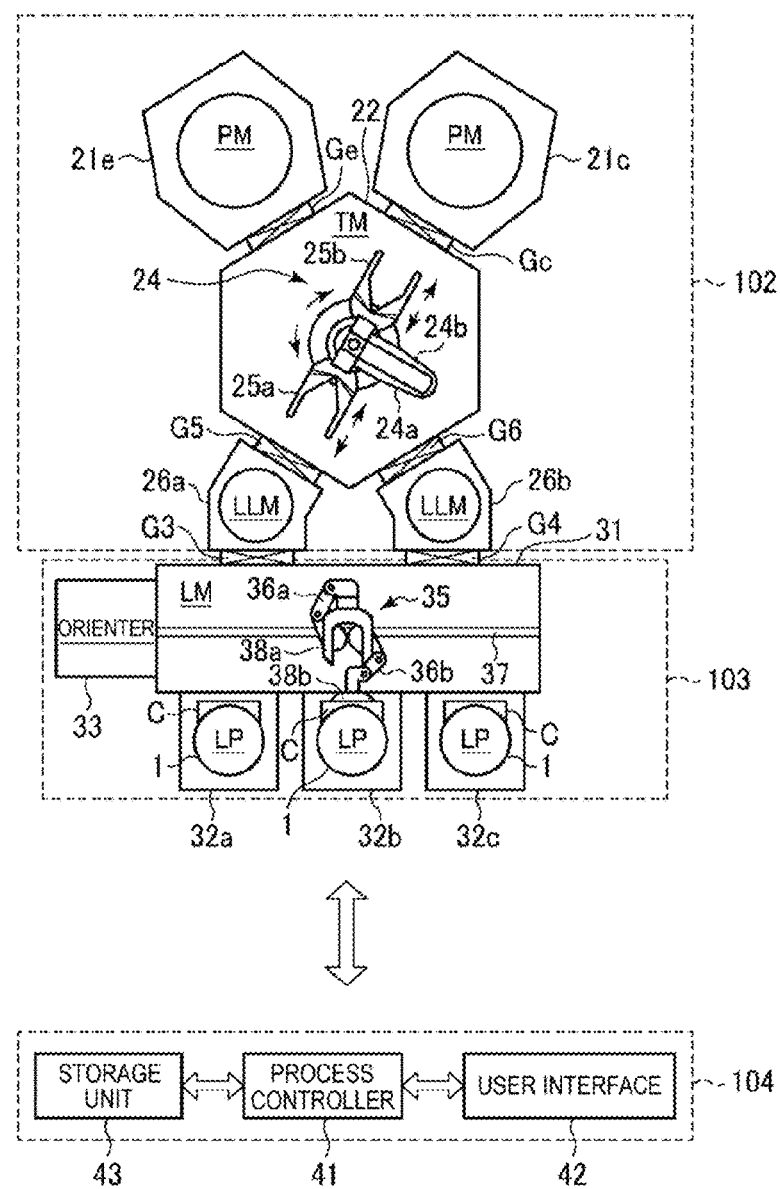
FIG. 12 is a top view showing one example of a second system configuration example of a processing system capable of carrying out the manganese-containing film forming methods according to the first and second embodiments of the present disclosure.

FIG. 12 is a top view showing one example of a second system configuration example of a processing system capable of carrying out the manganese-containing film forming methods according to the first and second embodiments of the present disclosure.

As shown in FIG. 12, a second processing system 201 differs from the first processing system 101 in that a degassing unit and a manganese metal deposition unit are formed into a single processing module. Thus, the second processing system 201 includes a degassing and manganese metal deposition unit 21e which is formed of a processing module for performing the degassing process (process 1) and the manganese metal deposition process (process 2), and a metal deposition unit 21c which is formed of a processing module for performing the metal deposition process (process 3). The processing unit 21e is connected to the transfer chamber 22 through a gate valve Ge. In other points, the second processing system 201 remains substantially the same as the first processing system 101.

As one example of the process performed in the processing unit 21e, the processing pressure is changed in the degassing process (process 1) and the manganese metal deposition process (process 2) without changing the setting temperature of, e.g., a stage heater (a substrate mounting table with a heating function) not shown. Taking an example of specific numerical values, while the setting temperature of the stage heater is fixed at 395 degrees C., the pressure within the processing unit 21e accommodating the silicon substrate 1 is set at a vacuum pressure (vacuum-evacuation is continuously performed during the degassing process) during the degassing process (process 1) and the pressure within the processing unit 21e is set at 133 Pa which is higher than the pressure available in the degassing process (process 1) during the manganese metal deposition process (process 2). If the processing pressure is changed as described above, the temperature of the silicon substrate 1 can be set at, e.g., about 270 degrees C. in the degassing process (process 1) and the temperature of the silicon substrate 1 can be set at, e.g., about 350 degrees C. in the manganese metal deposition process (process 2), thereby generating a temperature difference of about 80 degrees C. in the silicon substrate 1.

As described above, the pressure within the processing unit 21e during the degassing process (process 1) is kept low and the pressure within the processing unit 21e during the manganese metal deposition process (process 2) is kept higher than the pressure available in process 1. With this configuration, even if the setting temperature of the stage heater is not changed, it is possible to heat the silicon substrate 1 at a higher temperature in process 2 than in process 1. Thus, it is possible to reduce, e.g., the standby time taken from the change of the setting temperature of the stage heater to the stabilization of the temperature of the stage heater.

According to the second processing system 201, process 1 and process 2 are performed in the single processing unit 21e. This makes it possible to obtain an advantage in that, as compared with the first processing system 101, it is possible to reduce the transfer time required in transferring the silicon substrate 1 from the processing unit 21a for performing process 1 to the processing unit 21b for performing process 2. Moreover, the number of processing modules can be reduced by performing a plurality of processes in a single processing unit.

Accordingly, the second processing system 201 can obtain an additional advantage in that, as compared with the first processing system 101, it is advantageous in increasing the throughput when manufacturing an electronic device, e.g., a semiconductor integrated circuit device.

Figure 13:
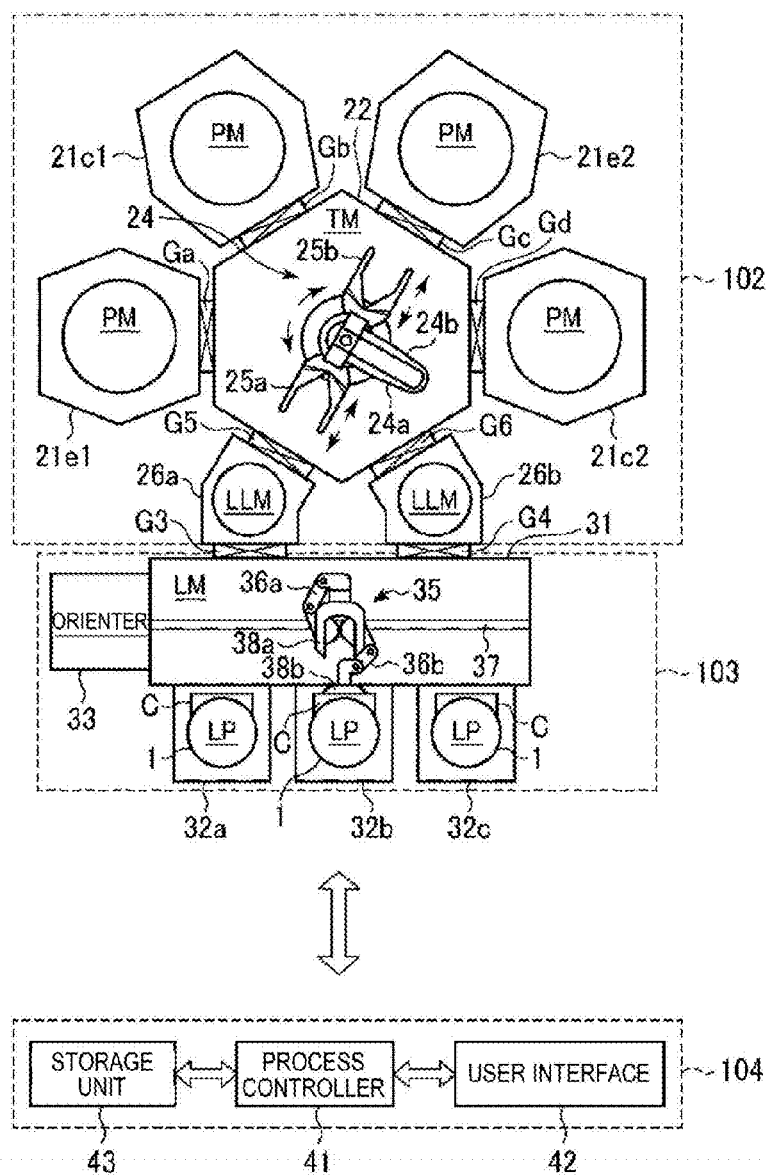
FIG. 13 is a top view showing another example of the second system configuration example of the processing system capable of carrying out the manganese-containing film forming methods according to the first and second embodiments of the present disclosure.

FIG. 13 is a top view showing another example of the second system configuration example of the processing system capable of carrying out the manganese-containing film forming methods according to the first and second embodiments of the present disclosure.

In the example of the second configuration example shown in FIG. 13, as compared with the example shown in FIG. 12, the processing unit 21e is increased to, e.g., two processing units 21e1 and 21e2 and the processing unit 21c is increased to, e.g., two processing units 21c1 and 21c2. If the processing units thus increased are arranged in a single processing system 201, it is possible to enhance the throughput twice.

The manganese-containing film forming methods according to the first and second embodiments can be carried out by the processing systems shown in FIGS. 12 and 13.

While the first to third embodiments of the present disclosure have been described above, the present disclosure is not limited to the first to third embodiments but may be appropriately modified without departing from the spirit of the present disclosure.

For example, the semiconductor substrate (semiconductor wafer), e.g., the silicon substrate, has been illustrated as a processing target on which a film composed of a manganese silicate or the like is formed. However, the processing target is not limited to the silicon substrate but may be a solar cell or a glass substrate used in the manufacture of a flat panel display.

In addition, the present disclosure is not limited to the manganese silicate film. Needless to say, the present disclosure may be applied to any element capable of forming a silicate (e.g., Mg, Al, Ca, Ti, V, Fe, Co, Ni, Sr, Y, Zr, Ba, Hf or Ta).

While certain embodiments have been described, these embodiments have been presented by way of example only, and are not intended to limit the scope of the disclosures. Indeed, the novel methods, systems and devices described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A manganese-containing film forming method for forming a manganese-containing film on an underlying layer containing silicon and oxygen, comprising:
    degassing the underlying layer formed on a processing target by thermally treating the processing target, the underlying layer containing silicon and oxygen; and
    forming a manganese metal film on the degassed underlying layer by chemical deposition using a gas containing a manganese compound,
    wherein forming a manganese metal film includes:
        setting a film formation temperature to be higher than a degassing temperature;
        introducing a reducing reaction gas; and
        forming a manganese-containing film including an interfacial layer formed in an interface with the underlying layer and a manganese metal film formed on the interfacial layer, the interfacial layer being comprised of a film of at least one of a manganese silicate and a manganese oxide.

2. A manganese-containing film forming method for forming a manganese-containing film on an underlying layer containing silicon and oxygen, comprising:
    degassing the underlying layer formed on a processing target by thermally treating the processing target, the underlying layer containing silicon and oxygen; and
    forming a manganese metal film on the degassed underlying layer by chemical deposition using a gas containing a manganese compound,
    wherein forming a manganese metal film includes:
        setting a film formation temperature to be higher than a degassing temperature;
        introducing a reducing reaction gas while controlling an amount of the reducing reaction gas; and
        forming a manganese-containing film including an interfacial layer formed in an interface with the underlying layer and a manganese metal film formed on the interfacial layer, the interfacial layer being comprised of a film of at least one of a manganese silicate and a manganese oxide, while controlling a thickness of the interfacial layer.

3. The method of claim 1, further comprising:
annealing, in a reducing atmosphere, the underlying layer on which the manganese metal film is formed, after forming a manganese metal film.

4. The method of claim 1, wherein the reducing reaction gas is at least one gas selected from the group consisting of a hydrogen gas, a carbon monoxide (CO) gas, an aldehyde (R—CHO) gas and a carboxylic acid (R—COOH) gas, where R is a functional group described by —$C_nH_{2n+1}$ (where n is an integer of 0 or greater).

5. The method of claim 1, wherein forming a manganese metal film includes setting the film formation temperature to be equal to or higher than a temperature at which a manganese oxide is converted into a silicate.

6. A manganese-containing film forming method for forming a manganese-containing film on an underlying layer containing silicon and oxygen, comprising:
degassing the underlying layer formed on a processing target by thermally treating the processing target, the underlying layer containing silicon and oxygen;
forming a manganese metal film on the degassed underlying layer by chemical deposition using a gas containing a manganese compound; and
annealing the underlying layer, on which the manganese metal film is formed, in a reducing atmosphere created by supplying a reducing gas,
wherein forming a manganese metal film includes setting a film formation temperature to be higher than a degassing temperature, and
wherein annealing the underlying layer includes:
setting an annealing temperature to be a temperature at which a manganese oxide is converted into a silicate; and
forming a manganese-containing film including an interfacial layer formed in an interface with the underlying layer and a manganese metal film formed on the interfacial layer, the interfacial layer being comprised of a film of at least one of a manganese silicate and a manganese oxide.

7. The method of claim 6, wherein the reducing gas is at least one gas selected from the group consisting of a hydrogen gas, a carbon monoxide (CO) gas, an aldehyde (R—CHO) gas and a carboxylic acid (R—COOH) gas, where R is a functional group described by —$C_nH_{2n+1}$ (where n is an integer of 0 or greater).

8. The method of claim 6, wherein annealing the underlying layer includes setting the annealing temperature to be equal to or higher than the temperature at which the manganese oxide is converted into a silicate.

9. The method of claim 1, wherein the underlying layer further contains water or hydrogen.

10. The method of claim 1, wherein forming a manganese metal film includes setting the film formation temperature to be equal to or higher than a thermal decomposition temperature at which the gas containing the manganese compound is thermally decomposed.

11. The method of claim 1, wherein at least a portion of the interfacial layer is formed at the side of the underlying layer.

12. The method of claim 1, wherein the gas containing the manganese compound is at least one gas selected from the group consisting of a cyclopentadienyl-based manganese compound gas, a carbonyl-based manganese compound gas, a betadiketone-based manganese compound gas, an amidinate-based manganese compound gas and an amideaminoalkane-based manganese compound gas.

13. The method of claim 12, wherein the cyclopentadienyl-based manganese compound gas is a manganese compound gas expressed by a chemical formula $Mn(RC_5H_4)_2$, where R is a functional group described by —$C_nH_{2n+1}$ (where n is an integer of 0 or greater).

14. The method of claim 12, wherein the carbonyl-based manganese compound gas is at least one gas selected from the group consisting of $Mn_2(CO)_{10}$, $(CH_3C_5H_4)Mn(CO)_3$, $(C_5H_5)Mn(CO)_3$, $(CH_3)Mn(CO)_5$ and 3-(t-BuAllyl)$Mn(CO)_4$.

15. The method of claim 12, wherein the betadiketone-based manganese compound gas is at least one gas selected from the group consisting of $Mn(C_{11}H_{19}O_2)_2$, $Mn(C_{11}H_{19}O_2)_3$, $Mn(C_5H_7O_2)_2$, $Mn(C_5H_7O_2)_3$, $Mn(C_5HF_6O_2)_2$ and $Mn(C_5HF_6O_2)_3$.

16. The method of claim 12, wherein the amidinate-based manganese compound gas is a manganese compound gas expressed by a chemical formula $Mn(R^1N—CR^3—NR^2)_2$, where $R^1$, $R^2$ and $R^3$ are functional groups described by —$C_nH_{2n+1}$ (where n is an integer of 0 or greater).

17. The method of claim 12, wherein the amideaminoalkane-based manganese compound gas is a manganese compound gas expressed by a chemical formula $Mn(R^1N—Z—NR^2_2)_2$, where $R^1$ and $R^2$ are functional groups described by —$C_nH_{2n+1}$ (where n is an integer of 0 or greater) and Z is a functional group described by —$C_nH_{2n+1}$ (where n is an integer of 0 or greater).

18. The method of claim 1, further comprising:
forming a metallic film on the manganese metal film formed in forming a manganese metal film.

19. The method of claim 18, wherein the metallic film is formed while subjecting the metallic film to a reflow by heating the processing target on which the manganese metal film is formed.

20. The method of claim 18, further comprising:
annealing the processing target, on which the metallic film is formed, in a reducing atmosphere.

21. The method of claim 18, wherein the metallic film contains copper.

22. An electronic device manufacturing method for manufacturing an electronic device which includes an interfacial layer including a film of at least one of a manganese silicate and a manganese oxide formed in an interface with an underlying layer containing silicon and oxygen, the method comprising:
forming the interfacial layer according to the manganese-containing film forming method of claim 1.

23. The method of claim 22, wherein the interfacial layer is a barrier film formed between a conductive metal wiring and the underlying layer serving as an inter-layer insulating film and configured to suppress diffusion of a conductive metal contained in the conductive metal wiring.

24. The method of claim 23, wherein the conductive metal forming the conductive metal wiring includes at least one element selected from the group consisting of copper, ruthenium and cobalt.

25. An electronic device, comprising:
an interfacial layer including a film of at least one of a manganese silicate and a manganese oxide formed in an interface with an underlying layer containing silicon and oxygen,
wherein the interfacial layer is formed according to the electronic device manufacturing method of claim 22.

26. The device of claim 25, wherein the interfacial layer is a barrier film formed between a conductive metal wiring and the underlying layer serving as an inter-layer insulating film and configured to suppress diffusion of a conductive metal contained in the conductive metal wiring.

27. The device of claim 26, wherein the conductive metal forming the conductive metal wiring includes at least one element selected from the group consisting of copper, ruthenium and cobalt.

28. A processing system for forming a manganese-containing film on an underlying layer containing silicon and oxygen, comprising:
- a degassing unit configured to perform a degassing process with respect to a processing target having the underlying layer containing silicon and oxygen;
- a manganese metal deposition unit configured to form a manganese metal film by depositing a manganese metal on the degassed processing target; and
- a metal deposition unit configured to form a metallic film by depositing a metal on the processing target on which the manganese metal is deposited,
- wherein the manganese metal deposition unit forms a manganese-containing film which includes an interfacial layer formed in an interface with the underlying layer and a manganese metal film formed on the interfacial layer, the interfacial layer being comprised of a film of at least one of a manganese silicate and a manganese oxide, according to the manganese-containing film forming method of claim 1.

29. The system of claim 28, wherein, if plural types of metal are deposited on the processing target, the metal deposition unit is comprised of a plurality of metal deposition units depending on the types of metals.

30. The system of claim 28, wherein the degassing unit and the manganese metal deposition unit are formed into a single degassing and manganese-metal-deposition unit.

31. The system of claim 30, wherein the degassing and manganese-metal-deposition unit is configured to change a processing pressure without changing a setting temperature in degassing an underlying layer and forming a manganese metal film, so that a difference between a temperature of the processing target in degassing an underlying layer and a temperature of the processing target in forming a manganese metal film is generated.

32. The system of claim 30, wherein each of the degassing and manganese-metal-deposition unit and the metal deposition unit is provided in plural numbers.

* * * * *